(12) United States Patent
Leburton et al.

(10) Patent No.: US 11,038,318 B2
(45) Date of Patent: Jun. 15, 2021

(54) QUANTUM IMPEDANCE MATCHING FOR CARRIER INJECTION IN TUNABLE TRANSISTOR-INJECTED QUANTUM CASCADE LASERS

(71) Applicant: The Board of Trustees of the University of Illinois, Urbana, IL (US)

(72) Inventors: Jean-Pierre Leburton, Urbana, IL (US); John Michael Dallesasse, Geneva, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 193 days.

(21) Appl. No.: 16/282,946

(22) Filed: Feb. 22, 2019

(65) Prior Publication Data
US 2019/0267773 A1    Aug. 29, 2019

Related U.S. Application Data

(60) Provisional application No. 62/635,225, filed on Feb. 26, 2018.

(51) Int. Cl.
| | |
|---|---|
| *H01S 5/34* | (2006.01) |
| *H01S 5/062* | (2006.01) |
| *H01S 5/22* | (2006.01) |
| *H01S 5/343* | (2006.01) |
| *H01S 5/042* | (2006.01) |
| *H01S 5/30* | (2006.01) |

(52) U.S. Cl.
CPC ............ *H01S 5/06206* (2013.01); *H01S 5/22* (2013.01); *H01S 5/3401* (2013.01); *H01S 5/3402* (2013.01); *H01S 5/343* (2013.01); *H01S 5/04257* (2019.08); *H01S 5/305* (2013.01); *H01S 2302/02* (2013.01)

(58) Field of Classification Search
CPC .. H01S 5/06206; H01S 5/3401; H01S 5/3402; H01S 5/22; H01S 5/343; H01S 5/04257; H01S 5/305; H01S 2302/02
See application file for complete search history.

(56) References Cited

PUBLICATIONS

Kanuo Chen, Fu-Chen Hsiao, Brittany Joy, and John M. Dallesasse "Quantum structures for recombination control in the light-emitting transistor", Proc. SPIE 10123, Novel In-Plane Semiconductor Lasers XVI, 1012318 (Feb. 20, 2017) (Year: 2017).*
Dallesasse, John, Chen, Kanuo. "Accessing the Mid-infrared And Beyond." Compound Semiconductor, Oct. 27, 2014 (Year: 2014).*

* cited by examiner

*Primary Examiner* — Xinning (Tom) Niu
(74) *Attorney, Agent, or Firm* — Brinks Gilson & Lione

(57) ABSTRACT

This disclosure relates to semiconductor quantum cascade lasers (QCLs). A three-terminal QCL device is disclosed. The three-terminal QCL device includes a unipolar multi-period quantum cascade laser structure embedded in a bipolar structure having three terminals providing at least two independently controllable biases to the QCL device for adjusting the lasing intensity and for tuning the lasing wavelength of the QCL device. The three-terminal QCL device further includes a quantum impedance matching structure for achieving high efficiency carrier injection and lowering lasing threshold. In addition, the multi-period quantum cascade laser structure is selectively doped to provide near charge neutrality during operation. The three-terminal QCL may further be controlled to achieve simultaneous dual- or multi-color lasing.

23 Claims, 19 Drawing Sheets

QUANTUM IMPEDANCE MATCHING FOR CARRIER INJECTION IN TUNABLE TRANSISTOR-INJECTED QUANTUM CASCADE LASERS

CROSS REFERENCE

This patent application claims priority to U.S. Provisional Patent Application No. 62/635,225 filed Feb. 26, 2018 and titled "Quantum Impedance Matching for Carrier Injection in Transistor-Injected Quantum Cascade lasers", which is herein incorporated by reference in its entirety.

TECHNICAL FIELD

This disclosure relates to the field of semiconductor devices for generating amplified electromagnetic radiation.

BACKGROUND

Quantum cascade lasers (QCLs) rely on radiative electron transitions between closely spaced conduction sub-bands in layered semiconductor structures to achieve amplified electromagnetic emission in the mid-infrared (MIR) or terahertz wavelength ranges. Laser output from the QCLs in these wavelength ranges may provide optical intensity and/or coherence for performing various sensing, testing, monitoring, imaging, and spectroscopic functions in a wide range of applications. In many of these applications, wide wavelength tunability may be desired or required. Some of these applications may further require a simultaneous multi-wavelength laser source in the MIR or terahertz ranges in addition to wavelength tunability.

SUMMARY

This disclosure relates to semiconductor quantum cascade lasers (QCLs). A three-terminal QCL device is disclosed. For example, the three-terminal QCL device may include a unipolar multi-period quantum cascade laser structure embedded in a bipolar structure having three terminals providing at least two independently controllable biases to the QCL device for adjusting the lasing intensity and for tuning the lasing wavelength of the QCL device. The three-terminal QCL device may further include a quantum impedance matching structure for achieving high efficiency carrier injection and for lowering lasing threshold. In addition, the multi-period quantum cascade laser structure may be selectively doped to provide near charge neutrality during operation. The three-terminal QCL may further be controlled to achieve simultaneous dual- or multi-color lasing.

In one implementation, a semiconductor laser device is disclosed. The semiconductor laser device includes comprising: a bipolar transistor structure including a semiconductor collector structure comprising a collector layer and a collector electrode in electric contact with the collector layer, a semiconductor base layer disposed on the semiconductor collector structure and a base electrode in electric contact with the semiconductor base layer, and a semiconductor emitter layer disposed on the semiconductor base layer and an emitter electrode in electric contact with the semiconductor emitter layer, where the semiconductor emitter layer is separate from the semiconductor collector structure. The semiconductor laser device may further include a unipolar semiconductor structure as part of the semiconductor collector structure sandwiched between the semiconductor base layer and the collector layer of the semiconductor collector structure, where the unipolar semiconductor structure may include a quantum cascade laser structure, and a quantum impedance matching structure stacked with and in electric contact with the quantum cascade laser structure, wherein the a quantum impedance matching structure interfaces with the semiconductor base layer of the bipolar transistor structure and the quantum cascade laser structure interfaces with the collector layer.

In another implementation, a method for producing amplified emission of electromagnetic radiation is disclosed. The method may include providing a bipolar transistor structure comprising a semiconductor collector structure comprising a collector layer and a collector electrode in electric contact with the collector layer, a semiconductor base layer disposed on the semiconductor collector structure and a base electrode in electric contact with the semiconductor base layer, and a semiconductor emitter layer disposed on the semiconductor base layer and an emitter electrode in electric contact with the semiconductor emitter layer, where the semiconductor emitter layer is separate from the semiconductor collector structure. The method may further include providing a unipolar semiconductor structure as part of the semiconductor collector structure sandwiched between the semiconductor base layer and the collector layer of the semiconductor collector structure, where the unipolar semiconductor structure may include a quantum cascade laser structure; and a quantum impedance matching structure stacked with and in electric contact with the quantum cascade laser structure, wherein the a quantum impedance matching structure interfaces with the semiconductor base layer of the bipolar transistor structure and the quantum cascade laser structure interfaces with the collector layer. The method may further include applying a first bias between the emitter electrode and the base electrode for controlling an electron injection into the quantum cascade laser structure to generate the amplified emission of electromagnetic radiation, and applying a second bias independent of the first bias between the base electrode and the collector electrode to control a wavelength of the amplified emission of electromagnetic radiation.

Other implementations will become apparent from the underlying principles of the detailed disclosure below.

BRIEF DESCRIPTION OF THE DRAWINGS

FIG. 8b shows calculated electron band edge profile in the QIM structure of FIG. 8a.

FIG. 9 shows calculated quantum confined electron levels and corresponding lower Quasi Bound States (QBSs) in the QIM structure of FIG. 8a.

FIG. 10 shows an alternative calculation for the quantum confined electron levels and corresponding lower QBSs in the QIM structure of FIG. 8a.

FIG. 11 shows another calculation for the a larger set of electron levels and corresponding QBSs in the QIM structure of FIG. 8a.

FIG. 15b shows calculated Transition Dipole Moments (TDMs) of various electron transitions between the confined energy levels of FIG. 15a.

FIG. 17 illustrates transition energies and TDMs for selected electron transitions between confined electron energy levels of FIG. 15a.

DETAILED DESCRIPTION

Figure 1:
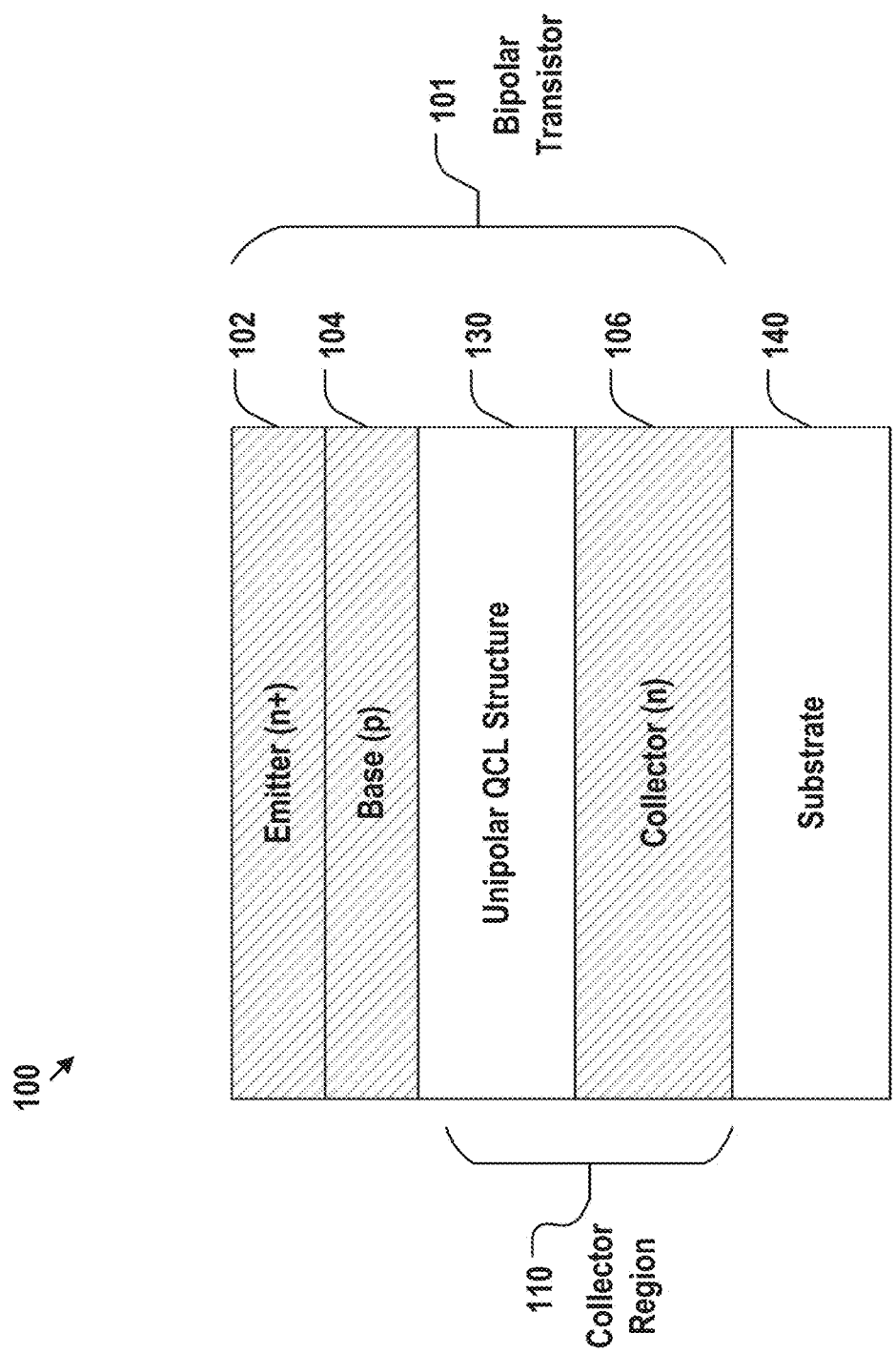
FIG. 1 illustrates an exemplary semiconductor laser device including a unipolar structure embedded in a bipolar structure.

A conventional unipolar Quantum Cascade Laser (QCL) device includes two terminals that may be used for applying an electrical bias to drive the QCL device to produce amplified coherent optical emission. The applied bias in the two-terminal QCL device affects both the carrier injection density and the wavelength of the optical transitions. As such, the carrier injection level and lasing wavelength are coupled and may not be independently controlled, leading to limited wavelength tunability. For the same reason, direct optical intensity modulation of the laser output is challenging in the conventional two-terminal QCL devices, as a direct modulation of the electric bias may adversely cause undesired shift in the output wavelength.

This disclosure describes various implementations of a three terminal QCL device having a conventional unipolar QCL structure embedded as part of a bipolar structure. The bipolar structure may be designed in different forms. For example, the bipolar structure may be in a form of a bipolar transistor. Such a mixed unipolar and bipolar structure may be referred to as a Transistor-injected QCL (TI-QCL) structure. As will be described in more detail below, multiple independent electric biases may be applied to the TI-QCL device via the three electric terminals, and the doping profile in the TI-QCL may be further controlled to: (1) facilitate independent control of carrier injection density and lasing wavelength, (2) improve wavelength tunability, (3) achieve laser intensity modulation via direct voltage modulation without wavelength shift, and (4) produce simultaneous dual- or multi-color laser output.

The various exemplary implementations of the TI-QCL structure may further include at least one intermediate structure engineered as an interface layer embedded between the conventional QCL structure and the bipolar transistor in the TI-QCL structure. Such an intermediate structure, herein referred to as a Quantum Impedance Matching (QIM) structure, may be designed as a quantum bridge with electronic energy bands for shaping carrier distribution and for efficiently injecting carriers into the proper quantum confined carrier levels in the optically active unipolar region of the TI-QCL structure.

The electric carriers in the TI-QCL structure may be of positive or negative charge. For simplicity purpose only, the disclosure below may specifically refer to electrons rather than generally referring to carriers. The implementations below that are applicable to electrons as the carriers can be modified without creative effort to arrive at other implementations that are applicable to holes as the carriers. Those other implementations are thus based on the same underlying principles described below and are within the scope of this disclosure. In addition, while specific material compositions and systems may be used as examples to illustrate various structures, calculations, energy levels, and other parameters in the implementations described below, other material compositions and systems may also be used, and the implementations described below may be correspondingly adapted to those material compositions and systems. Terms such as "light" and "optical emission" are used below to generally refer to electromagnetic radiation. Likewise, the term "laser" is generally used to refer to amplified coherent emission in any range of the electromagnetic spectrum.

FIG. 1 shows an exemplary implementation of a bipolar TI-QCL structure 100 capable of independent control of carrier injection density and emission wavelength. The TI-QCL structure 100 includes a bipolar transistor structure 101 disposed on a substrate 140. The bipolar transistor structure 101 includes an emitter region 102, a base region 104 and a collector region 110. The collector region 110 of the bipolar transistor structure 101 further includes a unipolar QCL structure 130 and collector 106. As such, the bipolar TI-QCL structure 100 in the exemplary implementation of FIG. 1 essentially includes a unipolar QCL structure monolithically integrated and embedded into the collector region 110 of the bipolar transistor structure 101. The term "collector region" may be alternatively referred to as "collection structure".

In the example of FIG. 1, the emitter region 102, base region 104 and collector region 110 forms the bipolar n-p-n structure 101. As such, the emitter region 102 may be n doped, the base region 104 may be p doped, and the collector 106 of the collector region 110 may be n doped. In some implementations, the emitter region 102 may be heavily n-doped to provide high electron injection into the collector region 110, whereas the base region 104 may be slightly p-doped (1) to reduce electron-hole recombination in the base region 104, thereby increasing electron diffusion into the collector region 110 for enhancing the transistor current gain, and (2) to minimize free-carrier absorption in the base region 104 of light emission generated by the unipolar QCL structure in the collector region 110. In some implementations, the collector region 110 including the unipolar QCL structure 130 and the collector 106 may be slightly n-doped. Such doping in the collector region 110 may (1) ensure that most of the electric bias that may applied between the base and the collector terminals (204 and 206 of FIGS. 2 and 3) is actually applied to the collector region 110 (particularly the QCL structure 130) rather than any depletion region within the base 104, and (2) serve as selective doping that may provide donors for balancing carrier injection space charge in the QCL structure to achieve charge neutrality (with more details being given below).

Figure 2:
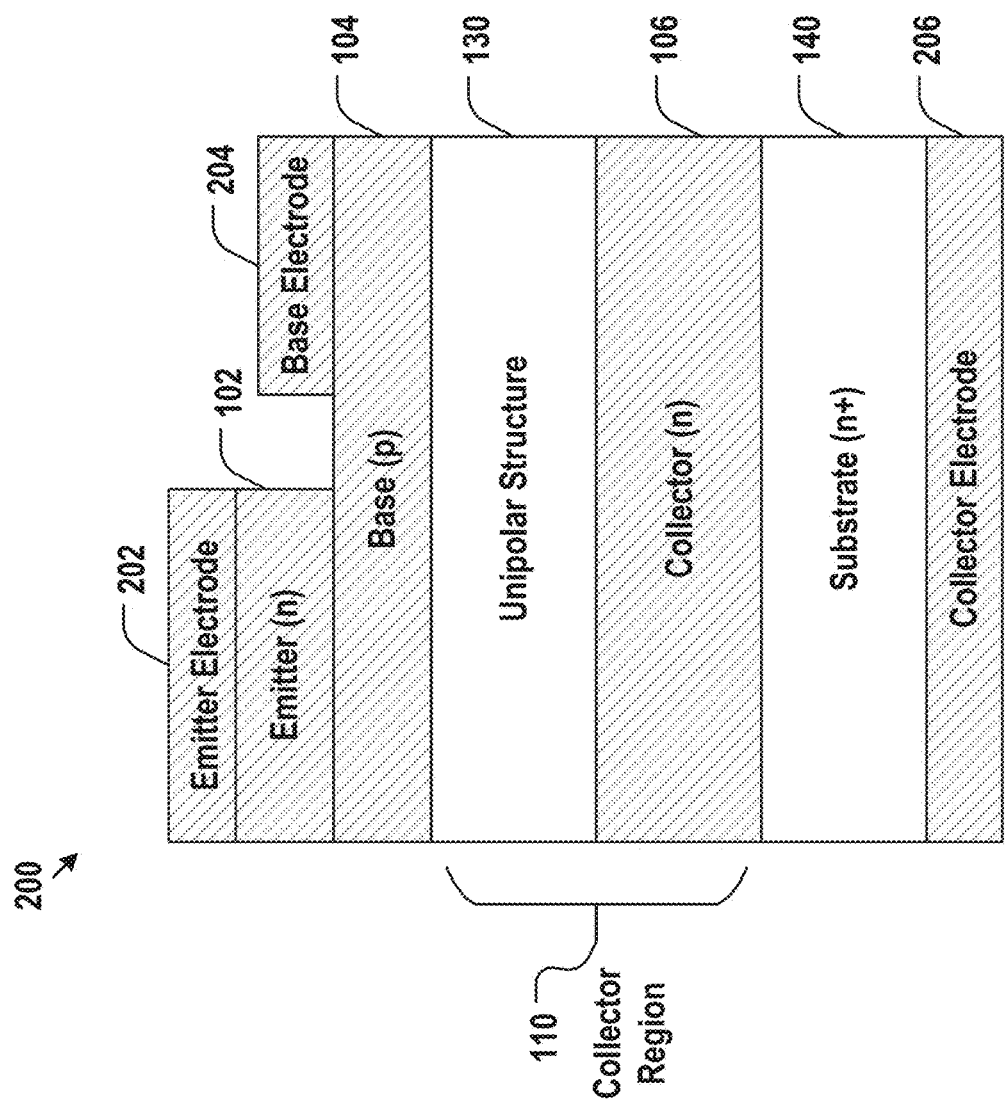
FIG. 2 illustrates an exemplary implementation of the semiconductor laser device of FIG. 1 including a unipolar structure embedded in a bipolar n-p-n transistor in a three-terminal configuration.

FIG. 2 further illustrates an exemplary electrode configuration for the bipolar TI-QCL structure 100 of FIG. 1 to form a three-terminal TI-QCL device 200. An emitter electrode 202 may be disposed on and in electric contact with the emitter 102 to form a first emitter terminal for the three-terminal TI-QCL device 200. A base electrode 204 maybe disposed on and in contact with the base 104 to form a second base terminal for the three-terminal TO-QCL device 200. In the implementation of FIG. 2, the three-terminal TI-QCL device 200 may be fabricated on a conductive substrate 140. For example, the substrate 140 may be heavily n-doped to achieve sufficient conductivity. The collector 106 may be disposed on and in electric contact with the conductive substrate 140. The conductive substrate 140 may be thinned to proper thickness and a collector electrode 206 may be disposed on and in electric contact with the back side of the conductive substrate 140, forming a third collector terminal for the three-terminal TI-QCL device 200, as shown in FIG. 2. The term "terminal" and the term "electrode" are used interchangeably in this disclosure.

Figure 3:
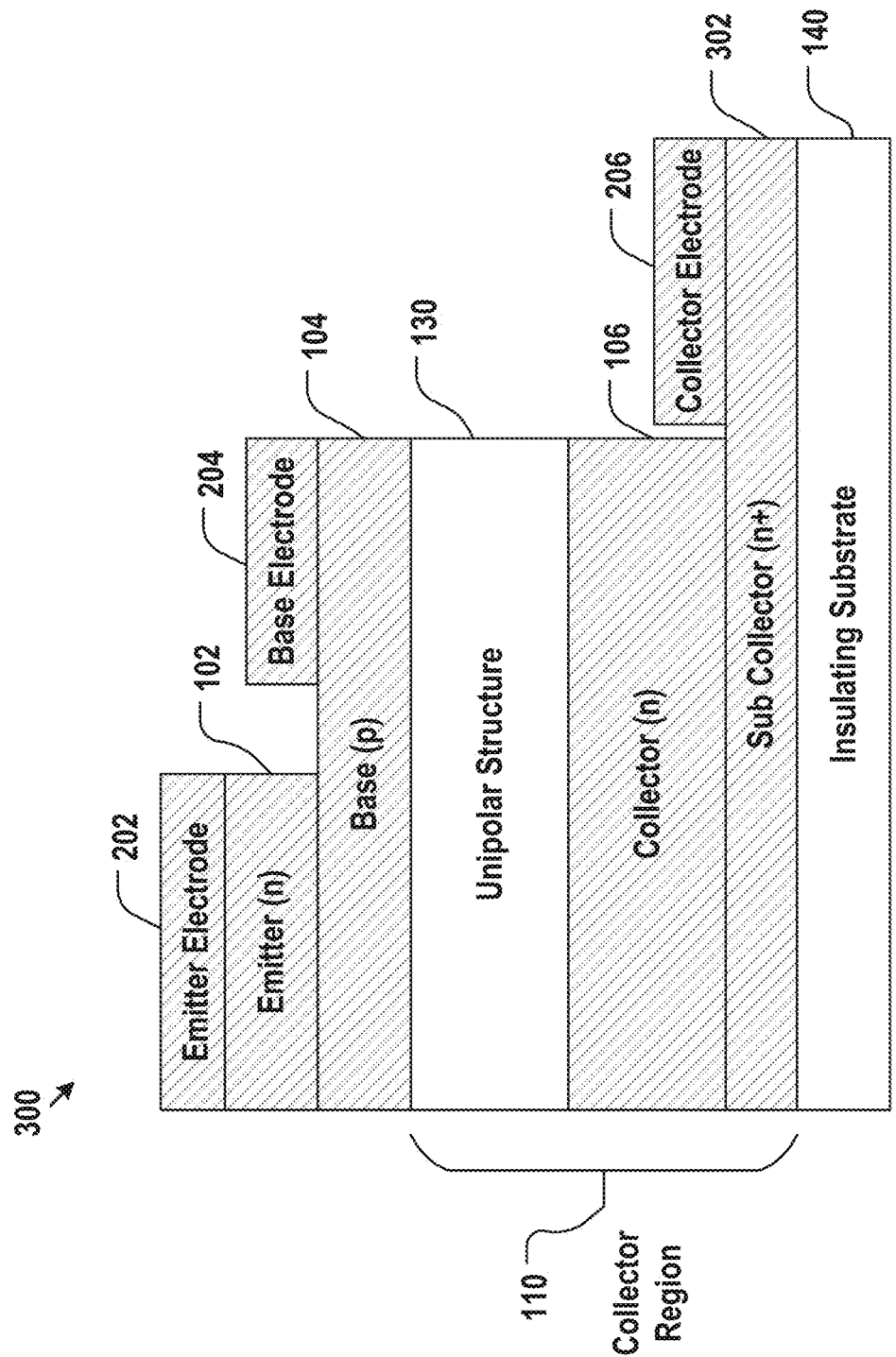
FIG. 3 illustrates an exemplary implementation of the semiconductor laser device of FIG. 1 including a unipolar structure embedded in a bipolar n-p-n transistor in another three-terminal configuration.

FIG. 3 shows an alternative electrode configuration for the bipolar TI-QCL structure 100 of FIG. 1 to form a three-terminal TI-QCL device 300. The three-terminal TI-QCL device 300 includes the first emitter terminal 202 and the second base terminal 204, similar to the three-terminal TI-QCL device 200 of FIG. 2. The three-terminal TI-QCL device 300, however, may be fabricated on an intrinsic or insulating 140 rather than a conducting substrate. As such, the collector region 110 of the three-terminal TI-QCL device 300 may include a sub collector 302 disposed between the insulating substrate 140 and the collector 106 in addition to the unipolar QCL structure 130 and the collector 106. The sub collector 302 may be heavily n-doped to achieve sufficient conductivity. The collector electrode 206 may then be disposed on and in electric contact with the sub collector 302 on a side of the sub collector 302 opposite to the insulating substrate 140. Further descriptions for the TI-QCL devices of FIGS. 2 and 3 can be found in U.S. Pat. No. 9,948,226 by the same Applicant, which is herein incorporated by reference in its entirety.

As shown in FIGS. 2 and 3, some of the electrodes may be disposed on a portion rather than an entirety of the emitter 102, base 104, or sub collector 302. Some of these electrodes may be fabricated by various patterning and etching steps after a layered structure is fabricated. The patterning and etching steps may be based on any fabrication and processing technologies. The electrodes may be patterned in any desired shapes and with any suitable gaps between them in the in-plane direction of the TI-QCL structure of FIGS. 2 and 3. The TI-QCL device layers may be fabricated based on, for example, epitaxial depositions such as metal organic chemical vapor deposition, molecular beam epitaxy, or any other suitable growth techniques. Any combinations of techniques used to fabricate heterojunction bipolar transistors (HBTs) and QCLs, mesa structure, Oxide aperture may be employed to fabricate the layered structure in the TI-QCL device and to pattern and define device profile.

The TI-QCL structure may be based on any type of semiconductor material systems and may be a combination of different type of semiconductor material systems. For example, the TI-QCL structure may be based on layered GaAs/AlGaAs/InGaP/InGaAs/InP or other III-V semiconductor materials with any suitable alloy compositions. In one implementation, the substrate 140 and collector region 110 may include GaAs, the base 104 may include GaAs or AlGaAs, the emitter 102 may include InGaAs, InGaP, or AlGaAs, and the quantum cascade structure layers may include GaAs or InGaAs quantum wells sandwiched in AlAs or AlGaAs barriers. In another implementation, the substrate 140 may include InP, the collector region 110 may include InGaAs or InP, the base region can be InGaAs or InP, the emitter 102 may include InP or InAlAs, and the quantum cascade structure layers may include InGaAs quantum wells sandwiched in InAlAs barriers. In addition to these and other III-V material systems, suitable II-VI material systems can also be employed.

Figure 19:
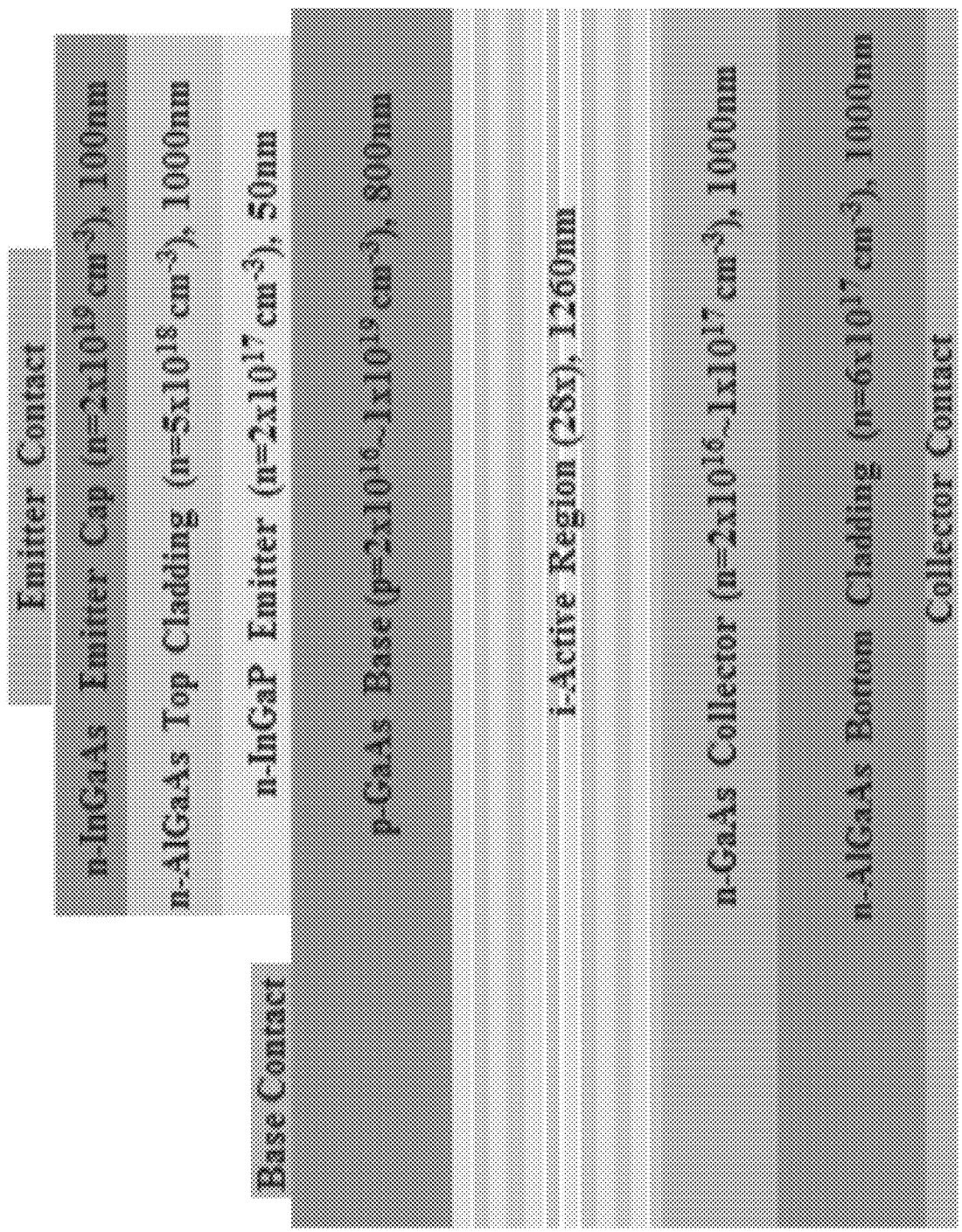
FIG. 19 shows an exemplary layer composition of the semiconductor laser device of FIG. 1.

Various dopants and doping levels may be used for the various component layers of the TI-QCL structure of FIGS. 2 and 3. In some implementations, the emitter 102 may be doped at $1 \times 10^{17}$-$5 \times 10^{19}$ cm$^{-3}$ For example, the emitter 102 may be doped at $2 \times 10^{19}$ cm$^{-3}$. In some implementations, the base 104 may be doped at $1 \times 10^{16}$-$2 \times 10^{19}$ cm$^{-3}$. For example, the base 104 may be doped at $5 \times 10^{17}$ cm$^{-3}$. In some implementations, the collector 106 may be doped at $1 \times 10^{16}$-$5 \times 10^{17}$ cm$^{-3}$. For example, the base 104 may be doped at $5 \times 10^{16}$ cm$^{-3}$. The emitter 102, the base 104 and the collector 106 may each include sublayers doped at the same or varying concentrations. The doping levels, the sublayers in each of the emitter 102, base 104, and collector 106 may be designed to provide desired carrier injection and electric field in the QCL. One exemplary layered TI-QCL structure is shown by 1900 of FIG. 19, with various exemplary doping levels indicated. Another example of the layered TI-QCL structure is shown in the table below, with doping levels indicated. The top n-doped layers function as the emitter 102. The p doped layers function as the base 104. The bottom n-doped layers function as collector 106. A 28-period active QCL structure is further included, which as will be described below, may be selective doped (not shown in the table below). The thicknesses of various layers in the FIG. 19 and the table below are merely examples. The thickness of the layers may be designed to provide any desired carrier injection, quantum confinement, band structures, and other characteristics of the TI-QCL device.

| InGaAs | n = $2 \times 10^{19}$ cm$^{-3}$ | 50 nm |
|---|---|---|
| GaAs | n = $5 \times 10^{18}$ cm$^{-3}$ | 50 |
| AlGaAs | n = $5 \times 10^{18}$ cm$^{-3}$ | 1000 |
| InGaP | n = $2 \times 10^{17}$ cm$^{-3}$ | 50 |
| GaAs | p = $1 \times 10^{19}$ cm$^{-3}$ | 50 |
|  | p = $5 \times 10^{17}$ cm$^{-3}$ | 500 |
|  | p = $2 \times 10^{16}$ cm$^{-3}$ | 250 |
| Active region (28x) |  | 1260 |
| GaAs | n = $2 \times 10^{16}$ cm$^{-3}$ | 250 |
|  | n = $1 \times 10^{17}$ cm$^{-3}$ | 750 |
| AlGaAs | n = $6 \times 10^{17}$ cm$^{-3}$ | 1000 |
| GaAs | n = $1 \times 10^{18}$ cm$^{-3}$ |  |

Figure 4:
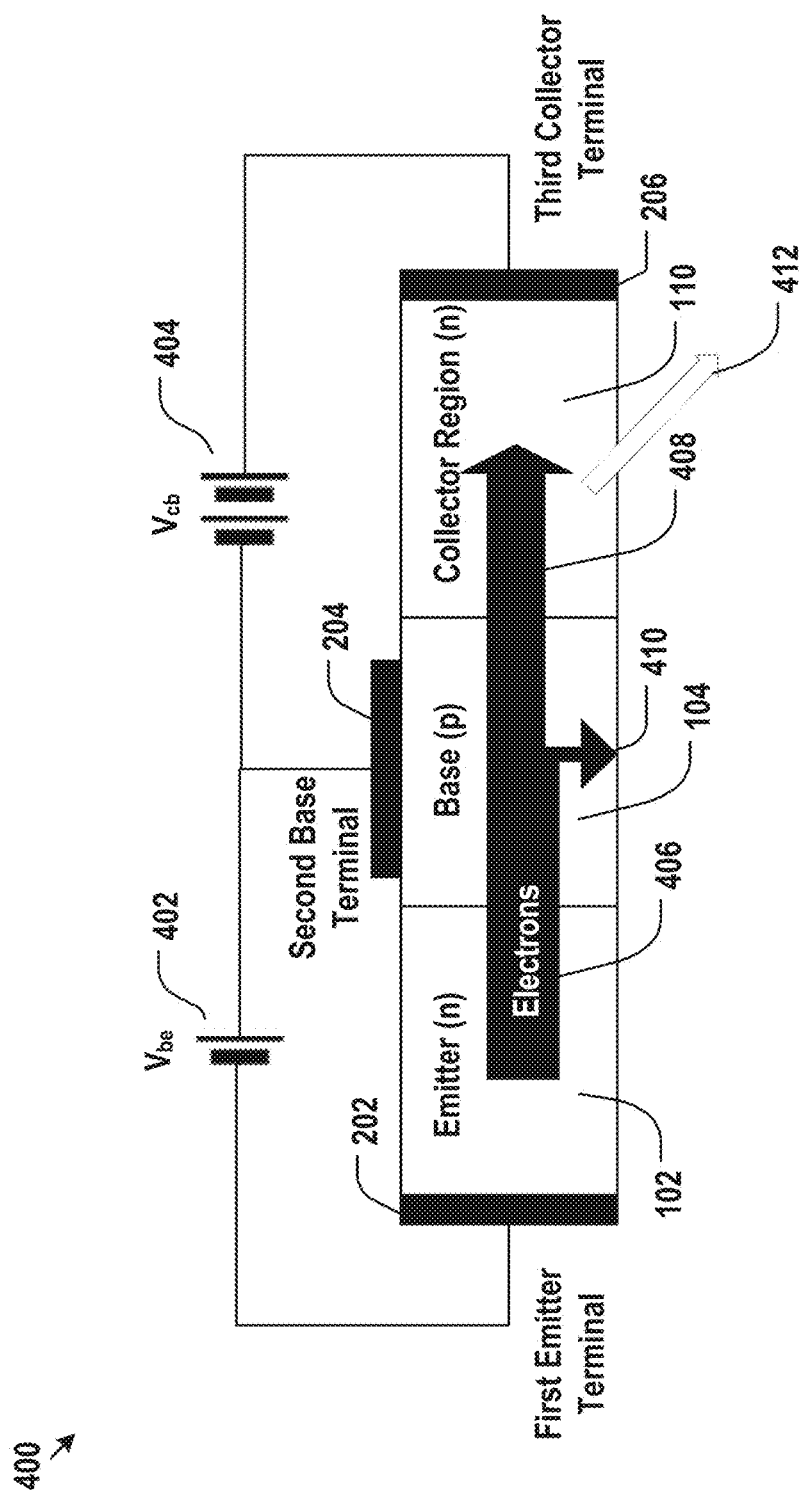
FIG. 4 illustrates an exemplary bias configuration for the semiconductor laser device of FIGS. 2 and 3.

FIG. 4 illustrates operation of the three-terminal TI-QCL device of FIGS. 2 and 3 under an exemplary external static bias configuration. As shown in FIG. 4, the p-i junction between the p-doped base 104 and the n-doped emitter 102 may be forward biased at $V_{be}$ 402 via the second base terminal 204 and the first emitter terminal 202, whereas the collector region 110 and base 104 may be reverse biased at $V_{cb}$ 404 via the third collector terminal 206 and the second base terminal 204. The electron flow in the three-terminal TI-QCL device under this bias configuration is illustrated by arrows 406. In particular, electrons are injected into the forward-biased n-p emitter-base junction, travel across a thin base region 104 having a thickness that may be significantly less than the diffusion length of electrons in the material of the base, and are collected by the reverse-biased base-collector p-i junction where they are swept out of the base-collector depletion region by the electric field created by the applied bias. The electron injection into the collector region 110 follows the basic principle under which current amplification in an n-p-n transistor is achieved. For example, the electron injection into the collector region 110 is determined and controlled by the current from the base electrode 204 and is approximately independent of the reverse bias $V_{cb}$ when the transistor operates in saturation regime. As such, the amount of electron injection into the collector region 110 is controlled by the base emitter forward bias $V_{be}$ 402. A small base current 410 can thus control a large emitter current 406 and collector current 408. The reverse bias $V_{cb}$ may be adjusted to create a desired electric field across the collector region 110 where laser action occurs without significantly impacting the electron injection density. Further descriptions can be found in U.S. Pat. No. 9,948,226 as incorporated by reference herein.

Figure 5:
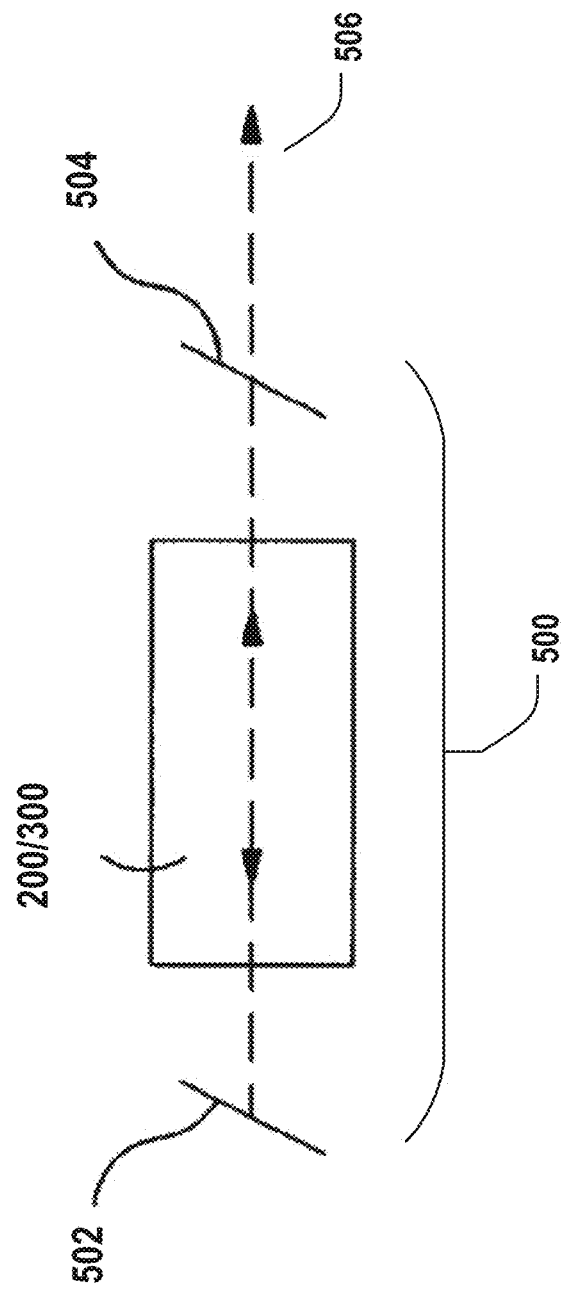
FIG. 5 illustrates an exemplary optical configuration for the semiconductor laser device of FIGS. 2 and 3 to achieve coherent light amplification.

As the electrons 408 in FIG. 4 flow through the collector region 110, they transition between the discrete electron energy levels in the unipolar QCL structure 130 to produce light emission 412. The light emission may be amplified coherently by the presence an optical cavity. FIG. 5 shows the three-terminal TI-QCL device 200 of FIG. 2 or 300 or FIG. 3 with at least a portion of its light-emitting region (collector region 110) enclosed within an optical cavity 500, defined by opposing reflectors 502 and 504. Reflector 504, referred to as an optical output coupler, may be partially transmissive for obtain a laser output 506. As is typical for an edge-emitting semiconductor laser device, the reflectors 502 and 504 may be formed by cleaved edges. For example, the left and right sides of the three-terminal TI-QCL devices 200 and 300 of FIGS. 2 and 3 may be cleaved to form smooth edges acting as optical reflectors based on a difference of optical refractive index between the two sides of each of the cleaved edges. In some other implementations employing a vertical emission configuration, the reflectors 502 and 504 may be formed using top and bottom distributed Bragg reflectors (DBRs). For example, one Bragg reflector having multiple layers of optical refractive materials having alternating refractive indexes may be disposed above the base 104 but within an aperture that does not overlap with the emitter 102 or the base electrode 204 in FIG. 2 to form the first end of the optical cavity. Another Bragg reflector having multiple layers of optical refractive materials may be disposed below the collector 106 to form the second end of the optical cavity. One or more layers of the substrate 140 and collector electrode 206 may be patterned and etched to form an aperture within which the second Bragg reflector is disposed. Those having ordinary skill in the art understand that any other suitable optical cavity or resonator configurations can be employed, and the device structure of FIGS. 2 and 3 may need to be correspondingly modified to accommodate the optical cavity and to maintain effective electron injection into the collector region 110 between the reflectors 502 and 504 (within the optical modes defined by the optical cavity 500).

Figure 6:
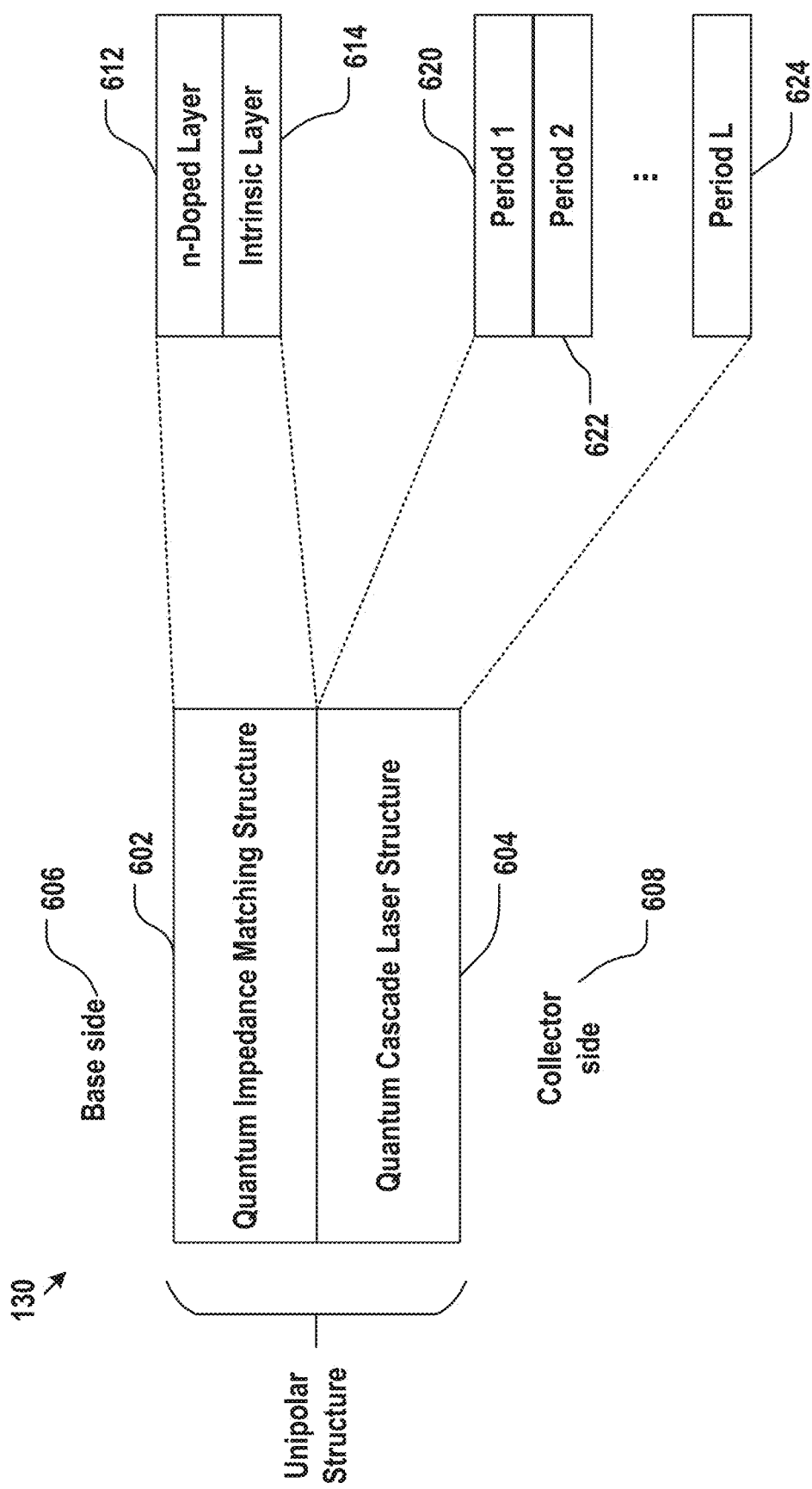
FIG. 6 shows an exemplary unipolar structure of FIGS. 1-3 including a quantum impedance matching (QIM) structure.

FIG. 6 shows an exemplary implementation of the unipolar structure 130 of FIGS. 1-3. The structure 130 is unipolar because it includes only at most one type of doping and it does not contain any bipolar junctions within itself, even though bipolar junctions may be formed at its interface with, for example, the base 104 of FIGS. 1-3. As shown in FIG. 6, the unipolar structure 130 may include a quantum impedance matching (QIM) structure 602 in addition to a quantum cascade laser structure 604. In the implementation of the unipolar structure 130 of FIG. 6, the QIM structure 602 interfaces with the base 104 on one side (as shown by 606) and with the quantum cascade laser structure 604 on the other side. The quantum cascade laser structure 604 interfaces with the QIM structure 602 on one side and the collector 106 on the other side, as shown by 608. In some implementations for the QIM structure 602, an n-doped semiconductor layer 612 and an undoped intrinsic semiconductor layer 614 may be included, with the n-doped layer 612 interfacing with the base 104 and the intrinsic layer 614 interfacing with the quantum cascade laser structure 604. The presence of the QIM structure 602 plays a critical role in facilitating efficient carrier injection from the base 104 into appropriate electron energy levels in the quantum cascade laser structure 614 under the bias configuration illustrated in FIG. 4.

The quantum cascade laser structure 604 of FIG. 6 may be implemented in a manner similar to a traditional multiple-period superlattices of quantum well structure as shown by period 1 (620), period 2 (622), . . . , and period L (624). In some implementations, each of the periods 1-L may include multiple layers of semiconductor materials forming a quantum well structure with quantum wells and barriers for conduction electrons and for forming discrete sub-conduction bands in the quantum wells as a result of quantum confinement of the electron motion in the direction perpendicular to the quantum wells. Multiple periods 620, 622, and 624, for example, may form semiconductor superlattices. The electron energy levels in each period may include electron injection sub-band, upper lasing sub-band, lower lasing sub-band, and electron removal sub-band. The energy spacing between the upper lasing sub-band and lower lasing sub-band may be in the MIR or terahertz frequency ranges, or other frequency ranges of the electromagnetic spectrum. Such energy level spacing may be higher than thermal energy at, e.g., room temperature, for facilitating radiative electron transitions rather than non-radiative relaxation such as photon assisted relaxation between the lasing sub-bands. The upper and lower lasing sub-bands may reside in the same or different (e.g., adjacent) quantum wells in each period.

Under the reverse $V_{bc}$ bias configuration illustrated in FIG. 4, the band structure in the quantum cascade laser structure 604 may be tilted as a function of the position of periods such that electron levels at the removal sub-band from period N (period 1 (620), for example) effectively align with the injection sub-band of period N+1 (period 2 (622), for example) to facilitate tunneling and cascading of electrons through the multiple periods. Light may be generated in each period as the electrons non-radiatively relax from the injection sub-band to the upper lasing sub-band and then radiatively relax from the upper lasing sub-band to the lower lasing sub-band, followed by non-radiative relaxation from the lower lasing sub-band to the electron removal sub-band. In some implementations, the electrons from a preceding period may tunnel directly to the upper lasing sub-band of the next period without a need for an injection sub-band. In some other implementations, electrons may tunnel directly from the lower lasing sub-band of a preceding period directly to the next period without a need for the electron removal sub-band. The operation of the quantum cascade laser structure 604 under the bias configuration illustrated in FIG. 4 was further described in more detail in U.S. Pat. No. 948,226 which is herein incorporated by reference.

FIGS. 7-12 illustrate functionality of the QIM structure 602 in achieving efficient injection of electrons into the quantum cascade laser structure 604 to facilitate radiative emission. FIGS. 7a and 7b show exemplary band structures of the three-terminal TI-QCL device 200 or 300 of FIGS. 2 and 3 with and without the QIM structure 602 of FIG. 6, respectively, under the bias configuration indicated in FIG. 4. In FIG. 7a, the Fermi levels for the emitter 102 and the base 104 are shown by 702 and 704, respectively. Without an external forward bias between the base-emitter p-n junction, the Fermi levels 702 and 704 would be leveled. Under the forward bias $V_{be}$ 402, the band bending between the emitter 102 and the base 104 is reduced and the Fermi level 702 of the emitter 102 is raised to a higher level relative to the Fermi level 704 in the base 104. Electrons are therefore injected from the emitter 102 into the base 104. The reverse bias $V_{cb}$ 404 between the base 104 and the collector 106 leads to an electric field and band tilting in the quantum cascade laser structure 604, as shown by the band tilting 706. At the interface between the base 104 and the quantum cascade laser structure 604, the conduction band edge experiences a sharp drop from the base 104 to the quantum cascade laser structure 604, forming a deep triangular potential well 708 for the conduction electrons. The lowest electron quantum levels in the triangular potential well 708 may be raised significantly (in other words, the electrons may be heated) and may be higher than the highest confined electron levels in the first period of the quantum cascade laser structure 604 adjacent to the base 104. These lowest electron quantum levels in the triangular potential well 708 may specifically be aligned with continuum levels in the first period of the quantum cascade laser structure 604. As such, the electrons may leak into these continuum states rather than tunneling into confined states of the first period of the quantum cascade laser structure 604. Electrons in the continuum states may be subject to fast non-radiative relaxation through the quantum cascade laser structure 604 rather than participating in the process of cascading radiative recombination between lasing levels in each period of the quantum cascade laser structure 604. As such, the deep triangular potential 708 may suppress or prevent lasing action from occurring in the quantum cascade laser structure 604.

Figures 7A, 7B:
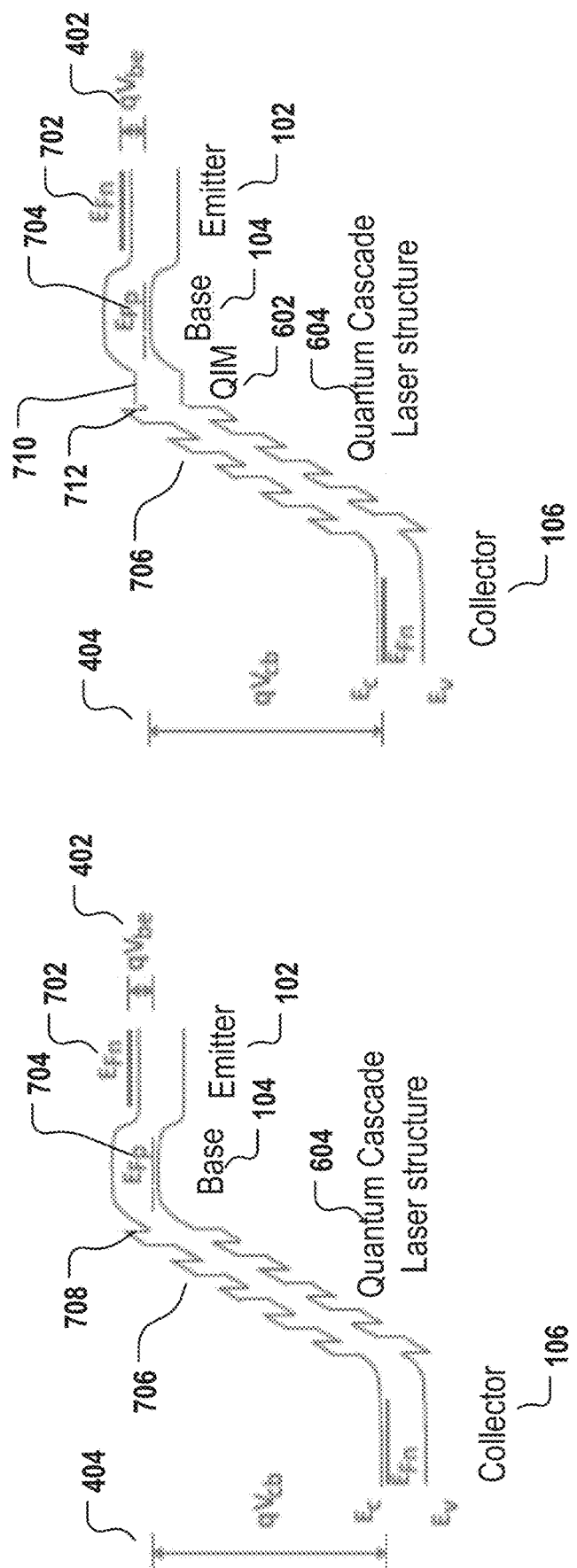
FIGS. 7*a* and 7*b* illustrate electron band edge of an exemplary semiconductor laser device with and without the QIM structure.

FIG. 7b shows that the addition of the QIM structure 602 between the base 104 and the quantum cascade laser structure 604 can reduce the adverse effect of the deep triangular potential 708 of FIG. 7a. For example, the QIM structure 602 may be designed such that the triangular potential trap 708 between the base 104 and the quantum cascade laser structure 604 in FIG. 7a is flattened to form a wide quantum well, as shown by 710 of FIG. 7b. Such flattening of the conduction electron band edge at the interface between the base 104 and the quantum cascade laser structure 604 leads to lower electron levels and facilitates a formation of a reservoir of low energy electrons at the interface. The lowered conduction electron levels at the interface between base 104 and the quantum cascade laser structure 604 may be further designed to align with quantum confined levels rather than continuum states at the first period of the quantum cascade laser structure 604. As such, electrons from the base 104 may be effectively injected into the quantum confined conduction electron levels rather than the higher continuum states of the quantum cascade laser structure 604. As a result, more electrons are subject to the cascading radiative relaxation process through the lasing levels in the quantum cascade laser structure 604.

Figure 8A:
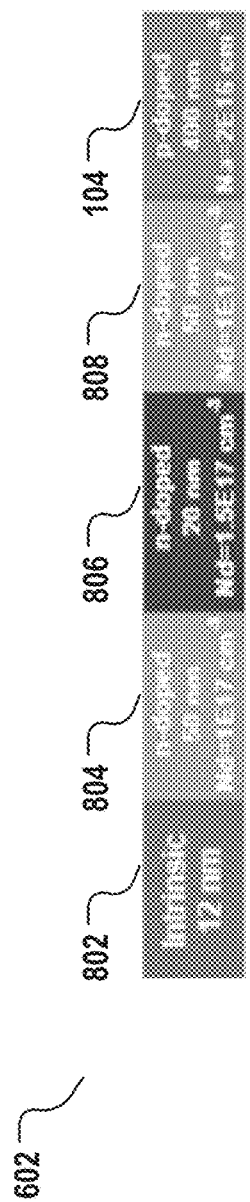
FIG. 8a shows an exemplary implementation of the QIM structure of FIG. 6.
Figure 8B:
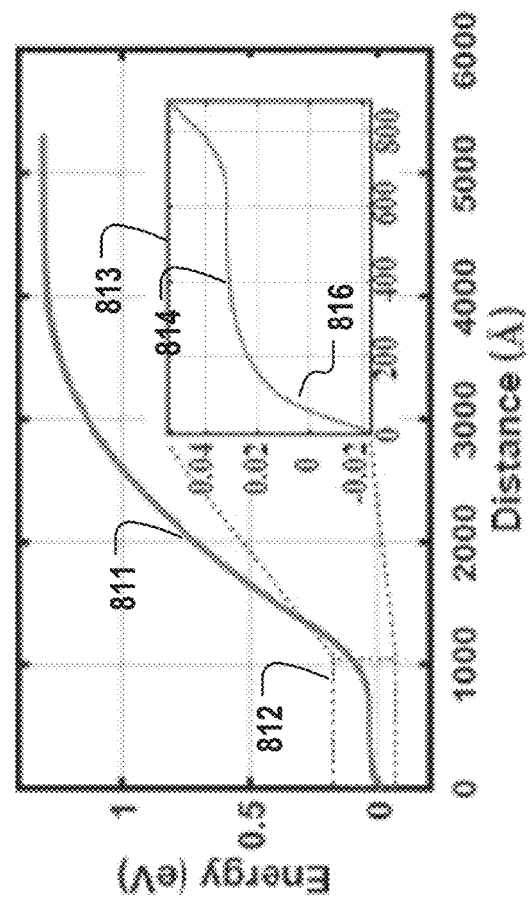

FIGS. 8a and 8b show an exemplary implementation of the QIM structure 602 and the resulting conduction band edge flattening from the base 104 and the quantum cascade laser structure 604 of FIG. 7b. The implementation of the QIM structure 602 shown in FIG. 8a includes an intrinsic layer 802 of 12 nm thickness, followed by a series of layers 804, 806, and 808, which are n-doped at carrier concentration of $1\times10^{17}/cm^3$, $1.5\times10^{17}/cm^3$, and $1\times10^{17}/cm^3$, and with thickness of 50 nm, 20 nm, and 50 nm respectively. The layer 104 with doping concentration of $2\times10^{16}/cm^3$ denotes the base layer. The intrinsic layer 802 interfaces with the quantum cascade laser structure 604 of FIG. 7b. In FIG. 8b, the sharp drop of conduction electron potential in the base is shown by 811. The flattening of the conduction electron potential by the QIM structure is shown by 812 and the insert 813 shows more details of the flattened potential 812. As shown by 813, the QIM structure of FIG. 8a provides a flattened band edge potential profile 814 of the conduction electron potential followed by a potential drop 816. The overall effect of potential profile 814 and 816 is to provide a flattened potential from 0 to about 800 nm from the quantum cascade laser structure 604 in the QIM layers compared to the potential profile in the base layer 104. As described above, such overall flattened potential profile facilitates a formation of a lower energy electron reservoir that may be energetically aligned with confined rather than continuum states in the first period of the quantum cascade laser structure 604.

The exemplary design of FIG. 8a for the QIM structure intentionally provide a local energy profile drop 816 towards the quantum cascade laser structure 604. Such a potential drop creates an electric field that helps sweeping the electrons in the low energy electron reservoir into the quantum cascade laser structure 604. Such potential drop may be designed such that a sweeping electric field is created without creating discrete energy levels into the continuum states of the first period of the quantum cascade laser structure 604. The potential drop 816 is preferably parabolic in shape such that the discrete confined electron levels in the potential profile 816 is approximately harmonic and supports energy levels of equal spacing, for reasons that will become apparent below with respect to FIG. 9.

The implementation of QIM in FIGS. 8a and 8b is merely one of many examples. Other QIM structure may be designed to provide a generally flattened electron energy profile in the QIM structure towards the quantum cascade laser structure 604 with a potential drop for generating the sweeping electric field. The n-doped layers 804, 806, and 808 of the QIM structure may be doped with other doping profile, may be of more complex doping profiles with more sub-layers. The doping profile may be continuously varied. The thickness of the various layers in FIG. 8a may be adjusted to approximately provide a desired electron energy band edge, such as the one shown in FIG. 8b.

Figure 9:
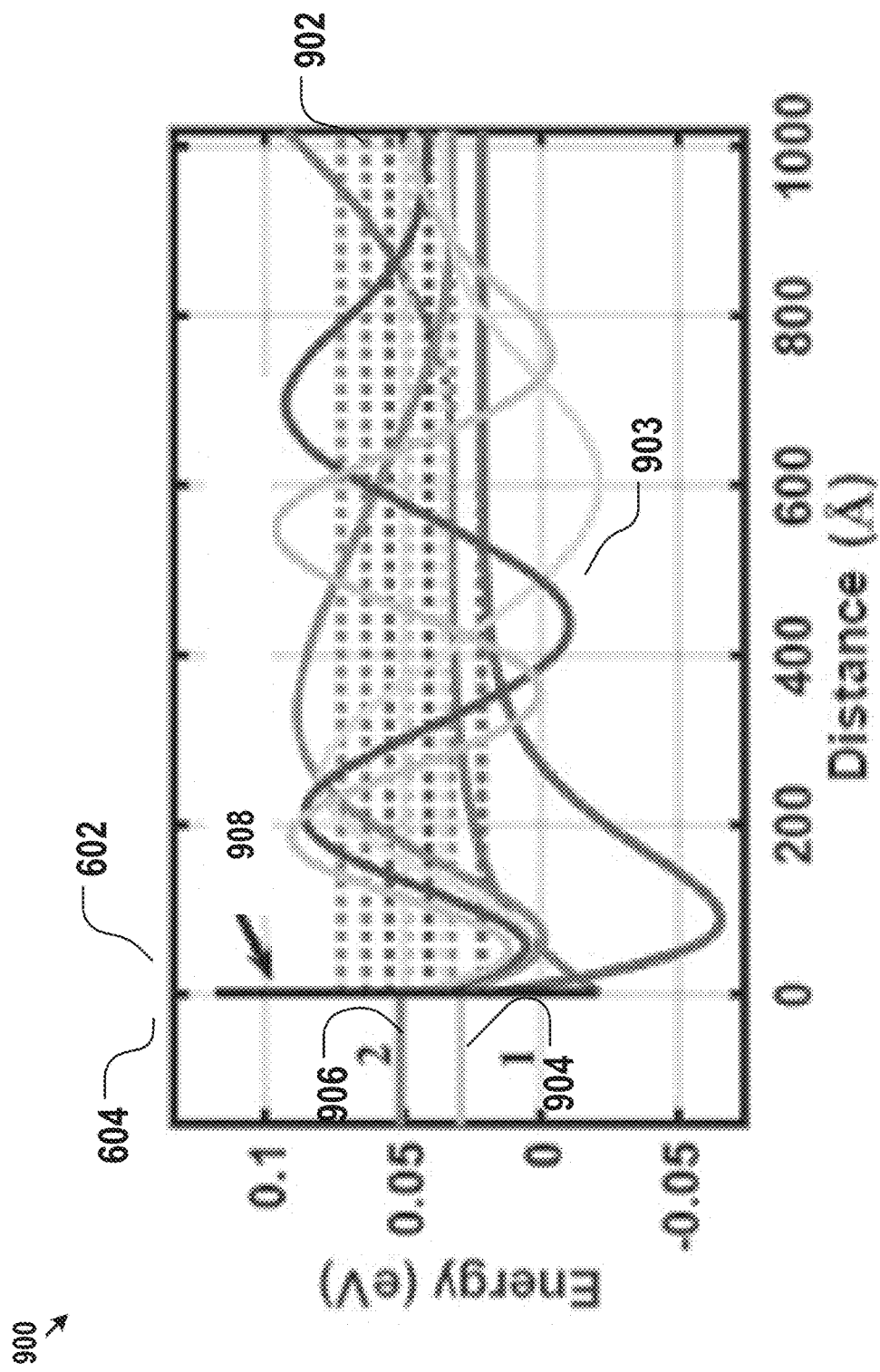

FIG. 9 further shows the quantized electron levels and Quasi-Bound States (QBSs) in the QIM structure 602 of FIG. 8. In the example of FIG. 9, the quantum cascade laser structure 604 and the QIM structure 602 interface at 908, and the lower quantized electron levels 902 in the QIM structure 602 are equally spaced in energy, reflecting a flattened parabolic potential profile in the QIM structure. These levels approximately align with the quantized conduction sub-band levels of the quantum wells in the first period of the quantum cascade laser structure 604, as indicated by level 1 (904) and level 2 (906). In particular, FIG. 9 shows eight lowest levels in the QIM structure 602 spread over a range of ~50 meV with the energy separations between adjacent levels ranging from 4 to 10 meV, which is smaller than the thermal energy at 300K (26 meV). Therefore, due to thermal broadening, electrons can easily couple between adjacent levels in the QIM structure 602 and be transmitted into the confined conduction levels 904 and 906 with significant injection efficiency. The curves 903 further illustrate electron wavefunctions corresponding to the eight lowest quantized conduction electron energy levels 902, showing that the electronic states are quasi-bound in the QIM structure 602.

The upper confined conduction level 906 in the first period of the quantum cascade laser structure 604 may act as an electron injection level and the lower confined conduction level 904 in the first period of the quantum cascade laser structure 604 may act as the upper lasing level. The lowest conduction electron energy levels 902 are approximately of equal spacing (see description above). As such the electrons in the low energy electron reservoir in the QIM structure 602 may be well mixed in all electron levels 902 independent of which of the levels the electrons are injected into from the base 104 (not shown in FIG. 9).

The curves of FIGS. 8b and 9 are obtained from a Self-Consistent Poisson Schrödinger (SCPS) solver at temperature T=300 K and for an electric field $F_0$=44 kV/cm at the hetero-interface of the quantum cascade laser structure 604. This $F_0$ value has been shown to be adequate for the cascading process in conventional QCLs. In order to speed up the SCPS calculation convergence, an infinite barrier for the first period of the quantum cascade laser structure 604 is assumed. As such, details of the layer composition of the quantum cascade laser structure 604 is not needed in the SCPS calculation. Independent calculation of the energy spectrum/levels and wavefunctions may be performed by more accurate CPB technique considering the realistic layer composition of the quantum cascade laser structure 604 rather than an infinite barrier. Such CPB calculation corresponding to the SCPS calculation of FIGS. 8b and 9 is shown in FIG. 10 for $F_0$=44 kV/cm.

The infinite barrier approximation in the SCPS scheme may result in an overestimation of quantum confinement for electrons in the QIM structure 602 as it ignores the evanescent nature of the electro wavefunctions, and the leakage of the wavefunctions into the quantum cascade laser structure 604 that lowers the quantum states in the QIM structure 602 with respect to the injection level and upper lasing level in the first period of the quantum cascade laser structure 604. However, in order to assess the influence of the QBSs on the QIM energy spectrum, the CPB calculation may be implemented by using a Numerov matrix approach to solve the complex eigenvalues and eigenfunctions of a non-Hermitian Schrödinger equation for the electrons. In this implementation, two regions with positive and negative imaginary potentials at two opposite boundaries act as injection and absorption regions, respectively. The CPB implementation is applied to an i/superlattice/i-n structure including a 30 nm intrinsic layer followed by 3 periods of superlattices for the quantum cascade laser structure and then the i-n QIM structure. It is assumed that the superlattices are uniformly biased at the electric field of 44 kV/cm, as in the SCPS calculation. The superlattice structure used in the calculation includes a GaAs/AlGaAs layer sequence in each period having [active region] [injection region] as [48,11,54,11,19, 46][30,26,30,20,28,18,30,17,34,28] in units of angstroms. The bold script denotes the $Al_{0.45}Ga_{0.55}As$ barriers while the standard script indicates the GaAs wells, and the underscores depict the n-doped layers (selective n-doping in the quantum cascade laser structure for neutralizing space charge due to electron injection is described further below).

Figure 10:
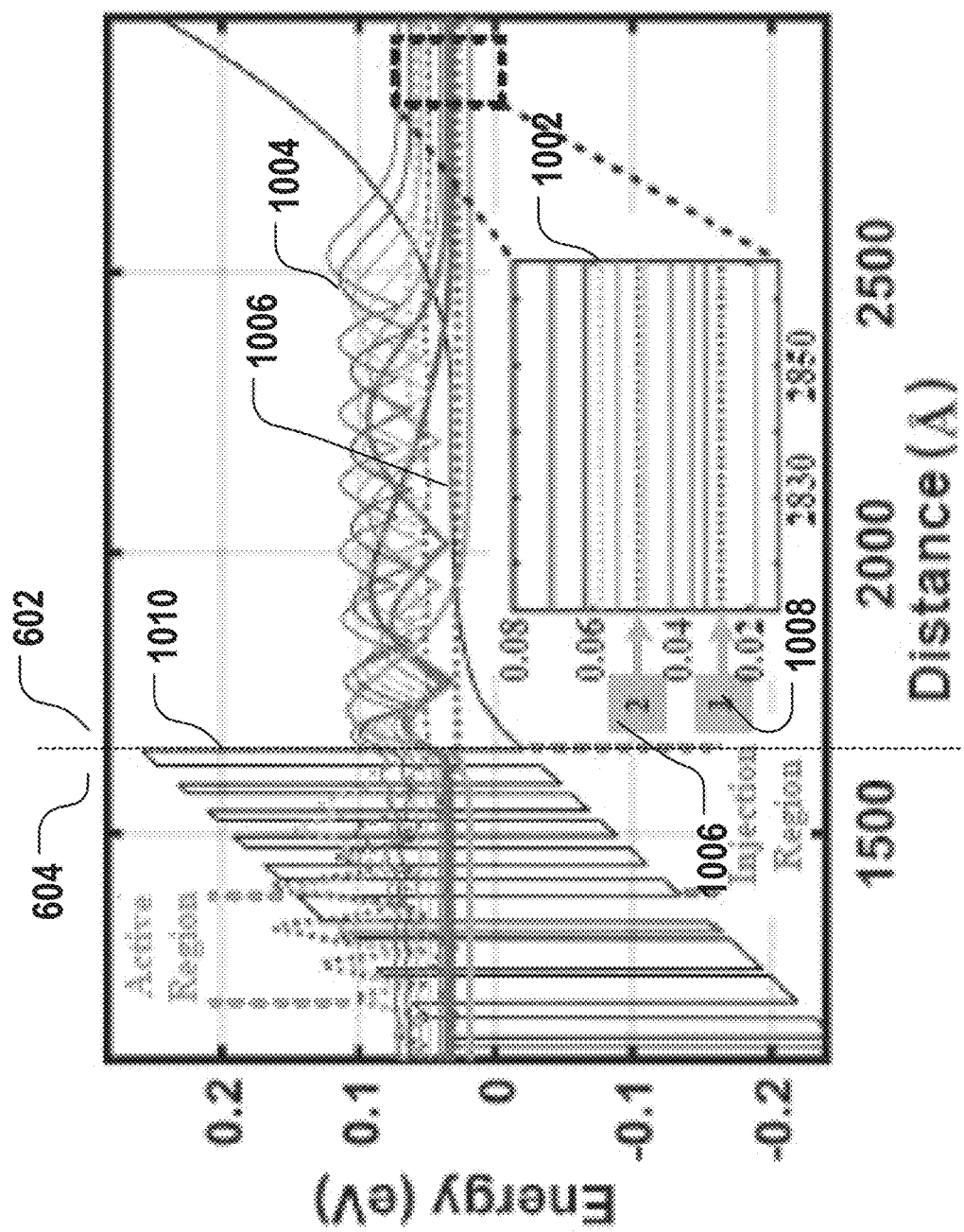

FIG. 10 shows slightly lower but similar lowest energy levels 1002 in the QIM structure 602 and similar upper lasing and injection levels 1006 and 1008 of the first period of the quantum cascade laser structure 604 labeled as level 2 and I to the SCPS calculation, which fall within the energy range of the lowest QIM energy levels 1002, providing a significant resonant tunneling from the QIM structure 602 to the first period of the quantum cascade laser structure 604. Specifically, FIG. 10 shows that in the QIM structure 602, there is one energy level below level 1 and five energy levels below level 2 of the first superlattice period, respectively, consistent with the results displayed in FIG. 9 for the SCPS calculation. As expected, all energy levels calculated by the CPB technique are slightly lower than in the case of infinite barrier of SCPS calculation, with an average energy absolute error of $\Delta E_{ave}$=1.2 meV. However, the relative energy error is less than 2.5% for most levels except the ground state. For the lowest QIM confined states in FIG. 10, the electron wavefunctions 1004 are mostly confined in the i-n QIM structure 602, indicating that the effect of evanescent wavefunctions induced by the finite barrier of the superlattice quantum cascade laser structure 604 can be ignored. The electron distribution used in the SCPS solver reads:

$$n(x) = \sum_j n_{c,j}(x) = \sum_j |\Phi_j(x)|^2 \frac{m^* k_B T}{\pi \hbar^2} \ln\left(1 + \exp\left(\frac{E_F - E_j}{k_B T}\right)\right) \quad (1)$$

where $\phi_j(x)$ and $E_j$ are the wave function and the energy of the $j^{th}$ QBS, respectively, $m^*$ is the effective mass of electron, $k_B$ is the Boltzmann constant, T is the temperature, and $E_F$=0 eV is the energy of Fermi level. The average relative error of the electron density in the lowest QBS in the QIM structure is calculated as follows:

$$\frac{|\Delta n|}{n} = \frac{\left|\sum_j \frac{\Delta n_{c,j}}{n_{c,j}}\right|}{8} = \sum_j \frac{\left|\ln\left(1+\exp\left(\frac{E_F - E_{inf,j}}{k_B T}\right)\right) - \ln\left(1+\exp\left(\frac{E_F - E_{sup,j}}{k_B T}\right)\right)\right|}{8*\ln\left(1+\exp\left(\frac{E_F - E_{sup,j}}{k_B T}\right)\right)} = 4.13\%,$$

which is tolerable. Therefore, although the CPB method lacks self-consistency, it nevertheless provides reliable results.

Figure 11:
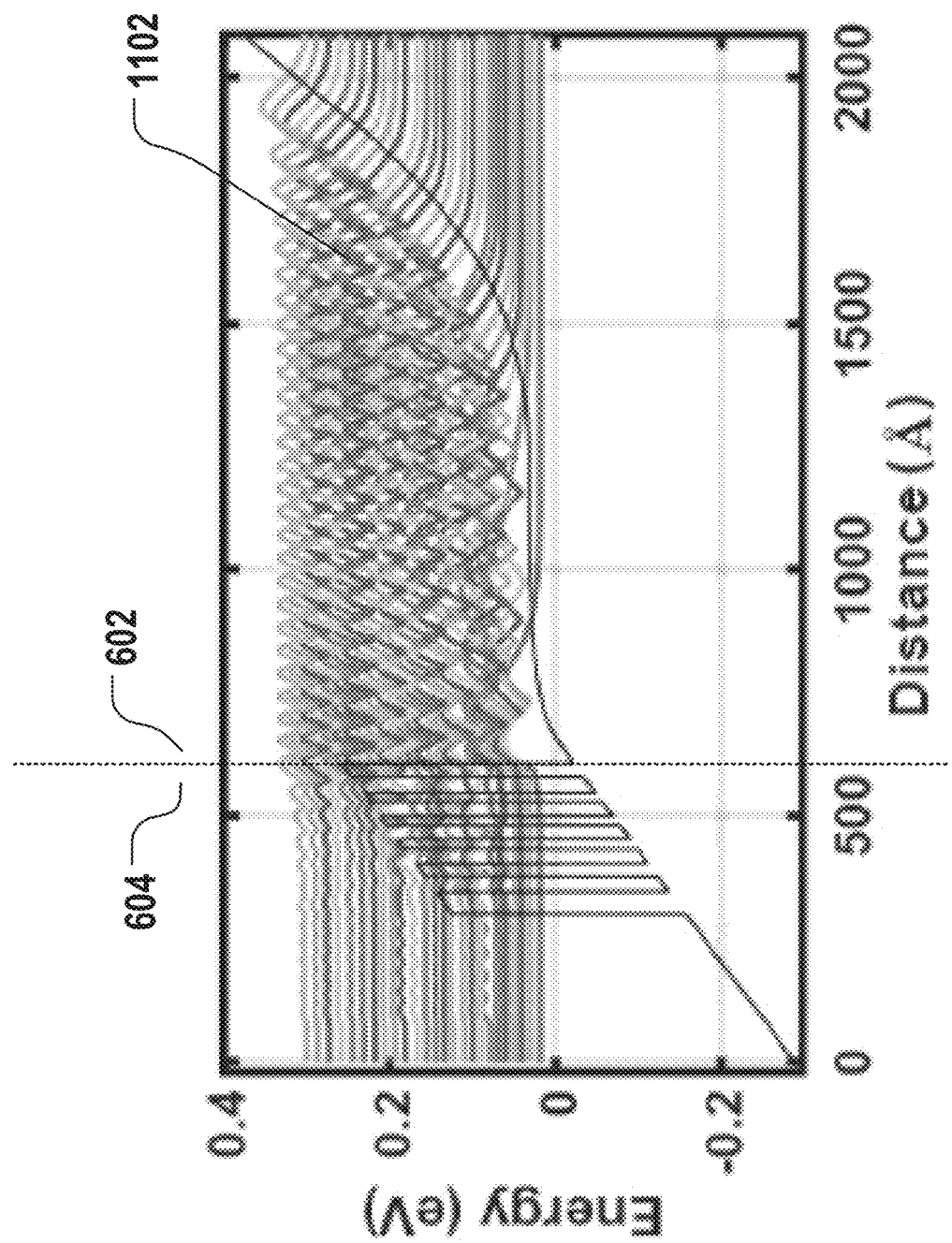

FIG. 10 shows that all of the lowest quantum states in the QIM structure 602 are quasi-bound. In order to assess the efficiency of electron injection from the different levels of the QIM structure 602 into the first active region of the superlattice quantum cascade laser structure 604, the CPB calculation is applied to the injection region in the first period of the superlattice quantum cascade laser structure 604 under the electric field of $F_0$=44 kV/cm, as shown in FIG. 11. Wavefunctions and imaginary part $\Im(E_j)$ of the complex eigenvalue of the $j^{th}$ QBS in the QIM structure 602 can be obtained (including the lowest QBSs of FIG. 10 and other higher energy levels, as shown by 1102 of FIG. 11), and corresponding lifetime $\tau_j$ and current densities $J_j$ can be calculated through $$\tau_j = \hbar / [2\Im(E_j)] \text{ and } J_j = \frac{q*n_{c,j}}{\tau_j}$$

respectively.

Figure 12:
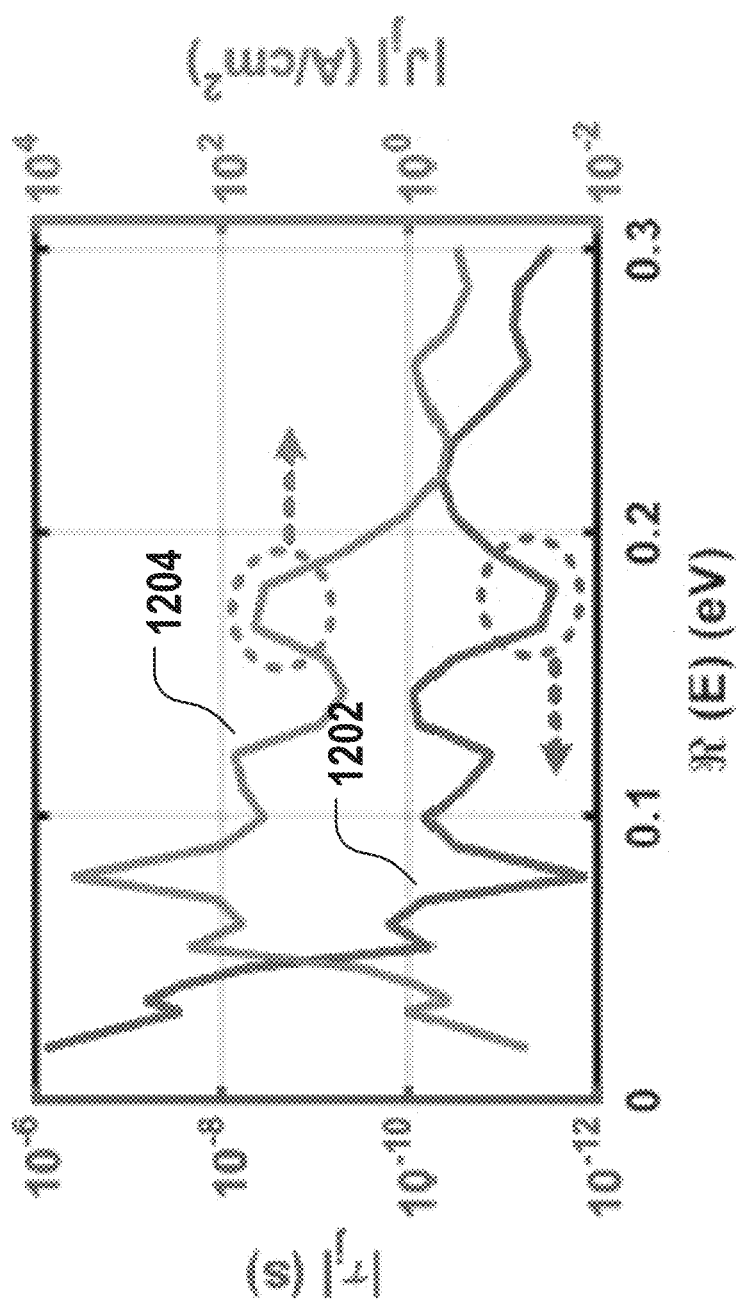
FIG. 12 shows a calculation for carrier lifetime and injection density into the unipolar structure under a particular bias across the unipolar structure.

The lifetime and current densities $J_j$ are shown in 1202 and 1204 of FIG. 12 as a function of electron energy, respectively. FIG. 12 shows that the QBS lifetime overall decreases with energy with sharp drops at 79, 167, and 181 meV because of the resonant transmission through the superlattice barriers. This is reflected in the current density which exhibits a sharp peak below 0.1 eV and a secondary broader peak between 0.15 and 0.2 eV. The current density first increases at low energy due to the decreasing lifetime, then decreases with the smaller electron density at high energy (Eq. 1). The total current density is $J_{total} = \Sigma_j J_j = 4.71$ kA/cm$^2$ in this example, which is comparable to the threshold current density (4 kA/cm$^2$) in a conventional QCL design. Therefore, FIG. 12 confirms that by adding an i-n QIM structure 602 between the quantum cascade laser structure 604 and the base region 104 to match their quantum impedance, the electron injection efficiency of the TI-QCL device is expected to be greatly enhanced to a level comparable to the conventional two terminal QCLs.

In the quantum cascade laser structure 604 of FIG. 6 under the bias configuration of FIG. 4 to produce high optical gain, the electron injection generates a significant steady-state electron population (or space charge) in the quantum cascade laser structure 604. Under Gauss's law, such electron population in turn acts to modify the linear electric potential profile that would otherwise be generated by the reverse $V_{bc}$ bias alone across the quantum cascade laser structure 604. The modified electric potential profile may become nonlinear across the quantum cascade laser structure 604, leading to variation in the strength of the electric field seen by different periods of the superlattices in the quantum cascade laser structure 604. Different electric fields at different periods of superlattices lead to different band tilting and different optical transition energies. When the superlattice periods in the quantum cascade laser structure 604 support different optical transition energies due the nonlinear electric field, optical gain for a particular energy or wavelength is reduced, leading to higher lasing threshold. As such, the cascading mechanism between successive optical transitions in the QCL prefers a constant electric field across all the periods of the superlattices for an enhanced optical gain. It is therefore desirable to negate or avoid the presence of space charge.

To negate the steady state space charge from the electron injection and maintain an approximate charge neutrality, the superlattice quantum cascade laser structure 604 may be selective n-doped across the superlattices. Under such n-doping, the positive charge of the field-ionized donors under the bias configuration of FIG. 4 may cancel the negative steady state space charge of the injected electrons.

If V and ρ represent the electric potential and charge density in the quantum cascade laser structure 604 respectively, their relationship may be governed by the Poisson equation, which reads as follow:

$$\frac{d^2 V}{dx^2} = -\frac{\rho}{\epsilon} = -\frac{q}{\epsilon}\left(N_d^+ - \frac{J_e}{q\langle v_s\rangle}\right) \quad (2)$$

where $\epsilon$ is the material permittivity, q is the elementary charge, $N_d^+$ is the donor concentration from the selective doping, $J_e$ is the current density, $\langle vs \rangle = L/\tau_d$ is the average equivalent electron velocity over the length L of one superlattice period, and $\tau_d$ is the electron dwelling time. Here, the net charge density over one superlattice period may be defined as:

$$\rho_L = q\int_0^L \left(N_d^+ - \frac{J_e}{q\langle v_s\rangle}\right) \quad (3)$$

Figure 13:
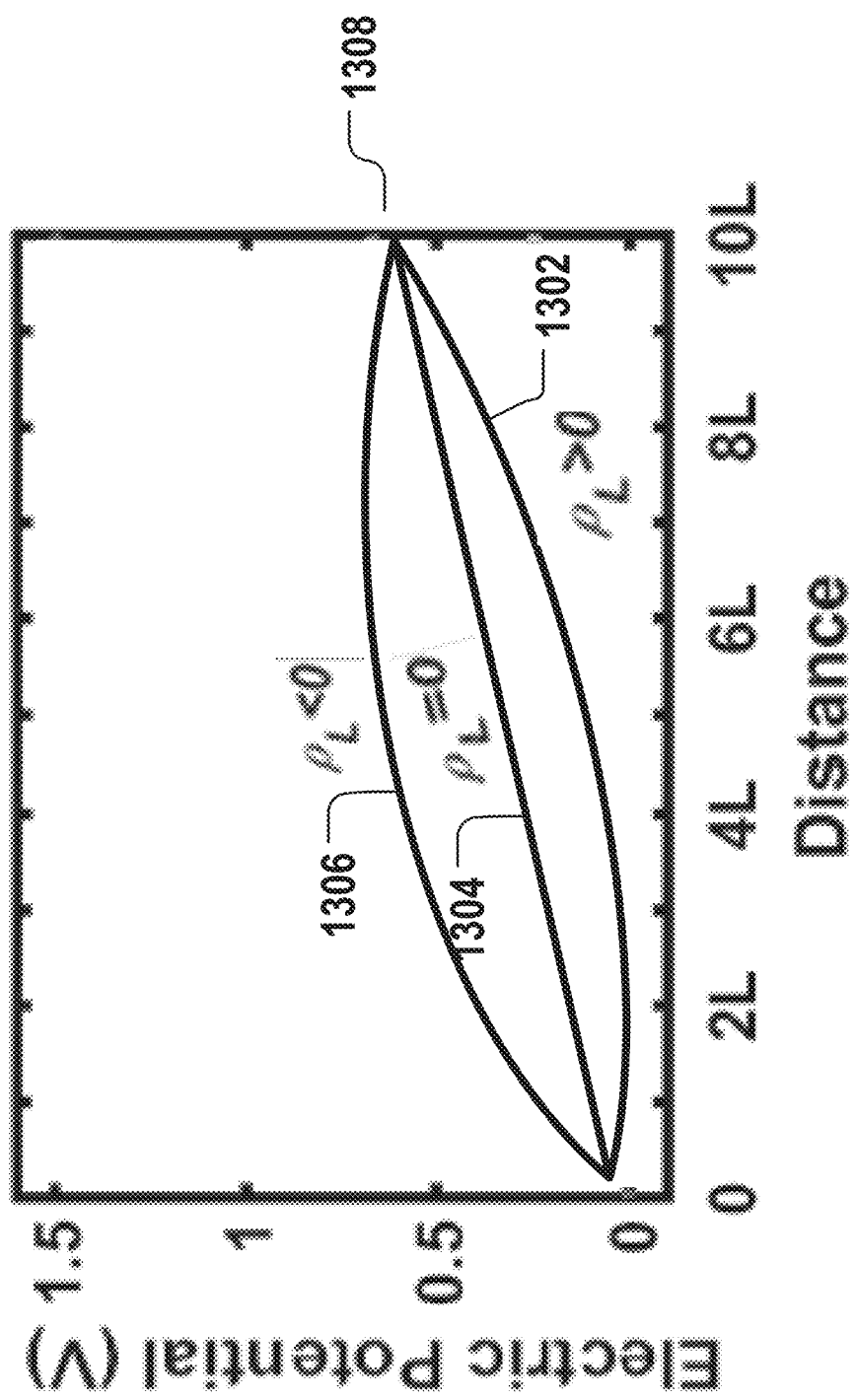
FIG. 13 illustrates effects of selective doping in the unipolar structure and steady state space charge due to carrier injection.

FIG. 13 illustrates the effect of the selective doping in the quantum cascade laser structure 604 on the electric potential across the superlattices periods. The selective doping is locally fixed in each superlattice period at an exemplary level of $N_d^+$ at, for example, 4E17 cm$^{-3}$. The electric potential curves (or potential profile) 1302, 1304, and 1306 are for exemplary electron injection rates of $J_e$=14.7 kA/cm$^2$, 13.3 kA/cm$^2$, and 10.7 kA/cm$^2$, respectively. The bias across the 10-period superlattices is at, for example, 0.67V, as indicated by 1308. FIG. 13 shows that different electron injection rates lead to different level of space charge. The space charge from the electron injection for the case of 1304 is neutralized by the selective doping, leading to a linear electric potential as a function of superlattice period and constant electric field. At higher or lower electron ejection rates, the selective doping is either insufficient or excessive for neutralizing the injection space charge, leading to nonlinear electron potential and varying electric field, as indicated by 1306 and 1302.

In more detail, as shown by the potential profile 1304, when $\rho_L$=0 (charge neutrality), the total potential energy variation is identical in each period of the superlattices, giving rise to a linear potential profile. As such, the lasing optical transition energies in each of the periods of the superlattices are identical, leading to large overlap of gain spectrum among all superlattice periods. In the case where the net charge $\rho_L \neq 0$, as shown by energy profiles 1302 and 1306, the electric potential varies non-linearly over the whole superlattices, inducing different electric fields and optical transition energies in different periods (leading to gain detuning between periods), with less gain overlap. Therefore, for achieving large gain overlap and lower lasing threshold, the linear potential profile 1304 with a net neutralized charge density may be preferred. Such charge neutrality may be achieved for a specific electron injection level and a corresponding selective doping. In the example of FIG. 13, charge neutrality is achieved at an electron injection rate of 13.3 KA/cm2 (as controlled by the forward base-emitter bias $V_{be}$) and at the particular selective doping of 4E17 cm$^{-3}$. As will be shown latter with respect to the simultaneous two-wavelength lasing capability of the TI-QCL device as illustrated in FIG. 18, a net charge level $\rho_L$ may be made vanishingly small without being zero, in which non-linear potential variations over several aligned superlattice periods are comparable, resulting in appreciable overlap of gain profiles in successive superlattice periods.

Under the condition of $\rho_L \approx 0$ for a given selective doping Nd+profile, the electron injection of the QCL is controlled such that charge neutrality is approximately maintained. The corresponding injection current would also determine the output laser power. In a two-terminal conventional QCL, electron injection density is determined by the voltage applied to the two terminals, and the same voltage is also used for controlling the optical transitions (e.g., aligning and controlling energies of the QBSs between successive superlattice periods, hence controlling the output laser wavelength). The two-terminal configuration of a conventional QCL thus offers little room for lasing tunability. In the three-terminal TI-QCL disclosed herein, on the contrary, the collector-base bias $V_{cb}$ controls the quantum alignment, thereby the optical transitions such as lasing wavelength in the superlattices, whereas the base-emitter bias $V_{be}$ determines the power of output laser by determining the current injection density. While the current injection causes space charge, such space charge may be neutralized by introducing proper amount of selective doping in the quantum cascade laser structure 604. Inversely, at a particular selective doping present in a fabricated TI-QCL device, the base-emitter bias $V_{be}$ may be controlled to achieve an electron injection level that provide charge neutrality. The three-terminal TI-QCL device disclosed herein thus offers greater design and operational flexibility for wide MIR and THz tunability by adjusting $V_{cb}$ across the QCL and $V_{be}$ in operation, and adjusting the level of selective doping in design.

At the specific injection rate (determined by $V_{be}$) and the $V_{cb}$ for achieving net charge neutrality, as shown by 1304 of FIG. 13, the tunability of the laser emission may be achieved by tuning the bias $V_{cb}$. Specifically, the bias Vcb may be tuned such that the charge neutrality is not substantively affected and the slope of the potential profile 1304 is modified without substantive change of its linearity.

Figure 14:
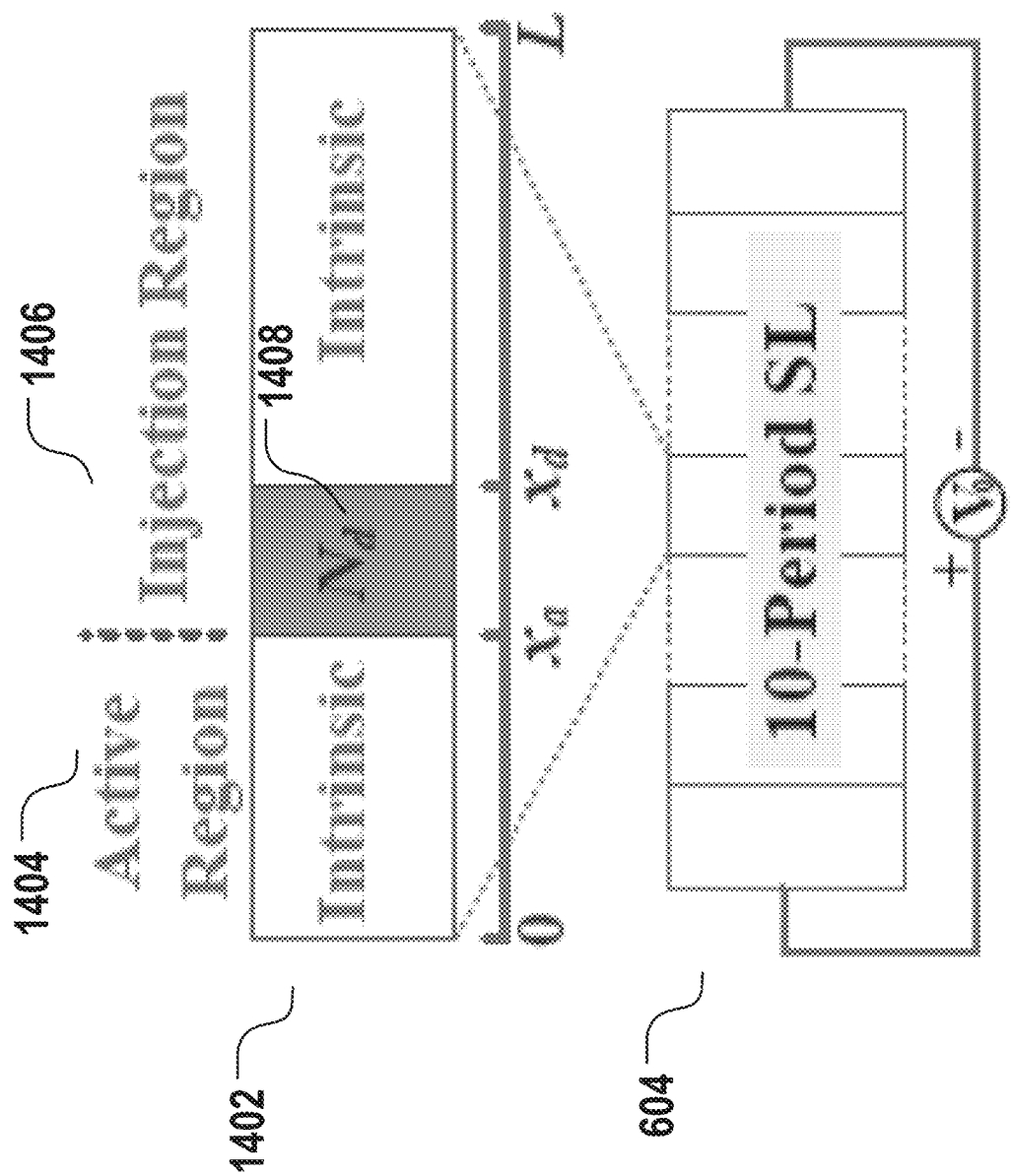
FIG. 14 shows an example of selective doping of the unipolar structure.

FIG. 14 shows an example of selective doping of the quantum cascade laser structure 604 having an exemplary 10 periods of superlattices. In the implementation of FIG. 14, each superlattice period is selectively doped, as shown in 1402. For example, each superlattice period may be divided into a layered active region 1404 and injection region 1406, and the dopants may be disposed at the end of the injection region adjacent to the active region, as shown by 1408. The doping configuration of FIG. 14 is merely one of many examples. Other doping profile may also be used for achieving the net charge neutrality discussed above. The dopants may be disposed in quantum wells, or in the barriers for the quantum wells in the superlattices. The dopants may be disposed into multiple separate quantum wells or barriers in each superlattice period. For another example, dopant may alternatively be disposed in each superlattice period with a continuously varying doping profile. The selective doping density may be between $10^{15}$ to $10^{19}$ cm$^{-3}$, for example.

Figure 15B:
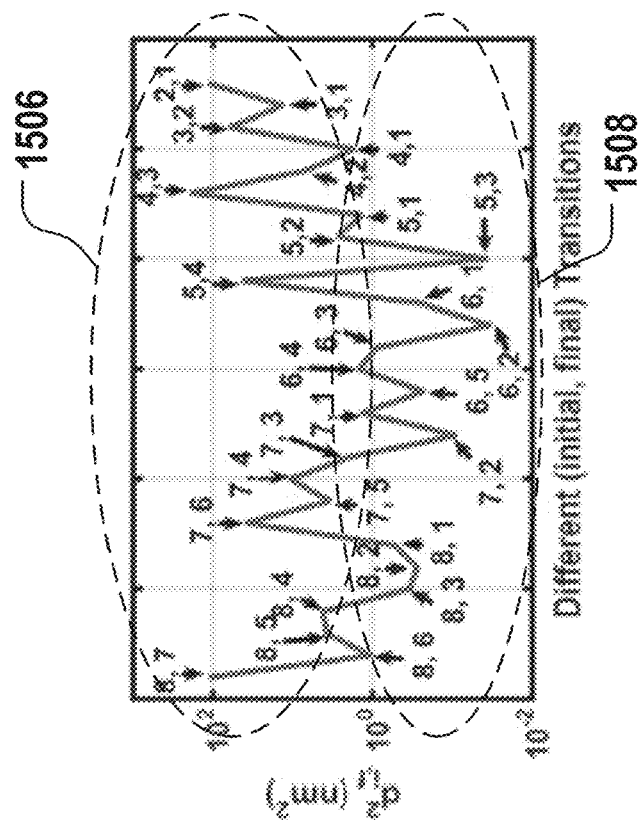
Figure 15A:
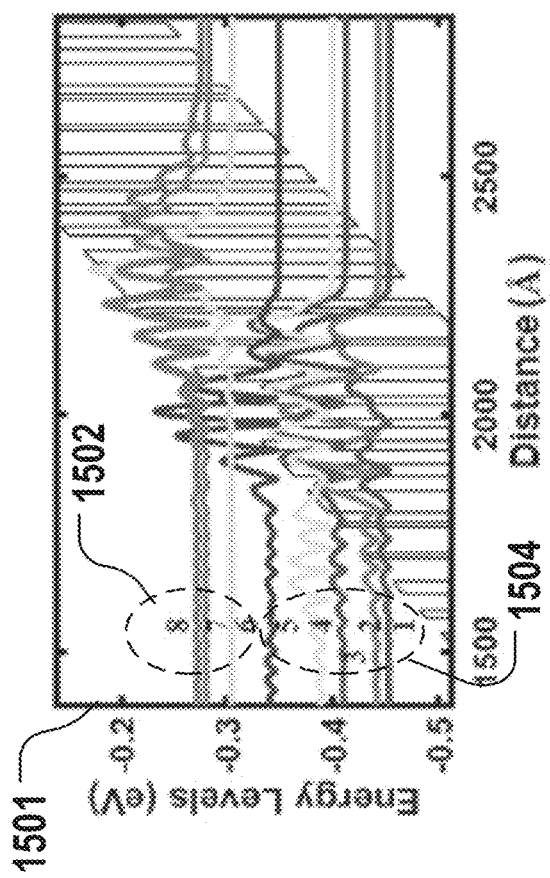
FIG. 15a illustrates calculated confined electron energy levels and wavefunctions in a period of superlattice of the unipolar structure.

Turning to the optical transitions and lasing process in the quantum cascade laser structure 604 of the TI-QCL device 200 of FIG. 2 or 300 of FIG. 3 under the selective doping and the bias configuration of FIG. 4, FIG. 15a shows the quantized energy levels and corresponding electron wavefunctions in one of 10 superlattice periods. Curves labeled from 1 to 8 show the electron wavefunctions at eight quantized electron energy levels indicating the bound nature of these electron wavefunctions. The baseline of the curves 108 are offset to indicate the eight energy levels according to the energy scale shown in the vertical axis 1501. The superlattice structure of FIG. 15a is similar to that of FIG. 10. The superlattices are biased under an electric field of 42 kV/cm. In this example, the energy levels 1-8 may be divided into two minibands 1502 and 1504. The upper miniband 1502 consists of levels 6-8 while the lower miniband 1504 contains levels 1-5.

In FIG. 15b, calculated Transition Dipole Moments (TDMs) for all different inter-level transitions (between levels 1-8) are shown. Lasing action may be based on transitions having relatively high TDMs. The calculation in FIG. 15b shows a group of transitions 1506 having relatively high TDMs and another group of transitions 1508 having relatively low TDMs. The energy levels involved for each of these TDMs are indicated by the level pairs in FIG. 15b. For example, strongest TDMs come from the (8,7) and (7,6) transitions between the energy levels within the upper miniband on one hand, and for (5,4), (4,3), (3,2) and (2,1) between the energy levels within the lower miniband on the other hand. However, for these transitions, energy levels involved in the transitions are close enough that electron distribution overlaps and these transitions may occur in the form of quick non-radiative relaxation. Within the transitions between the upper miniband and the lower miniband, the (7, 4) inter-miniband transition dominates in TDM and is likely where the lasing action will occur. The rest of the levels in the upper and lower minibands may operate as electron injectors and removers, respectively. As such, in the example of FIGS. 15a and 15b, the lasing action in a superlattice period may follow the process of i) injection of electrons into the superlattice period through one of the levels 6-8, ii) quick redistribution of the injected electrons among the upper minibands, iii) optical emission and amplification based on the (7,4) lasing transition, iv) quick redistribution of electrons falling to the lower lasing level 4 among the energy levels in the lower miniband, and v) removal of electrons from the current superlattice period and injection of electrons into the next superlattice period. Under the appropriate selective doping level as discussed above, the radiative transition energies are similar between different superlattice periods, leading to enhanced optical gain.

Figure 16:
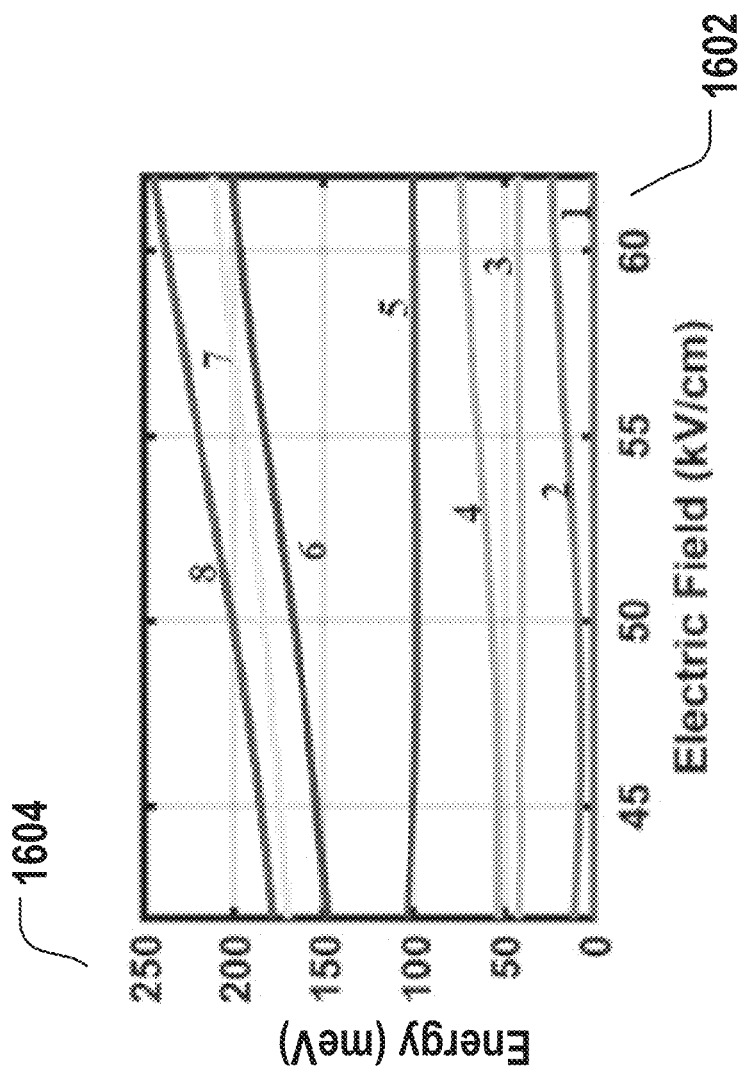
FIG. 16 illustrates variation of confined electron energy levels of FIG. 15a as a function of electric field applied across the unipolar structure.

FIG. 16 further illustrate the shift of energy levels 1-8 of FIG. 15a in meV 1604 as a function of the electric field 1602 across the superlattice period from 42 KV/cm to 62 KV/cm. As shown in FIG. 16, as the electric field increases, levels 6-8 move to higher energy while the levels 1-5 remain practically constant, resulting in an increasing separation between the upper miniband and the lower miniband of FIG. 15a. Correspondingly, the transition energies between the energy levels also vary as a function of the electric field. Because the electric field across the superlattice period is determined by the bias $V_{cb}$ among other parameters, adjusting the bias $V_{cb}$ can tune the electro transition energies, particular the transition energies (or wavelength) of the lasing optical transitions. The calculation shown in FIG. 16 may be based on the CPB method discussed above.

Figure 17:
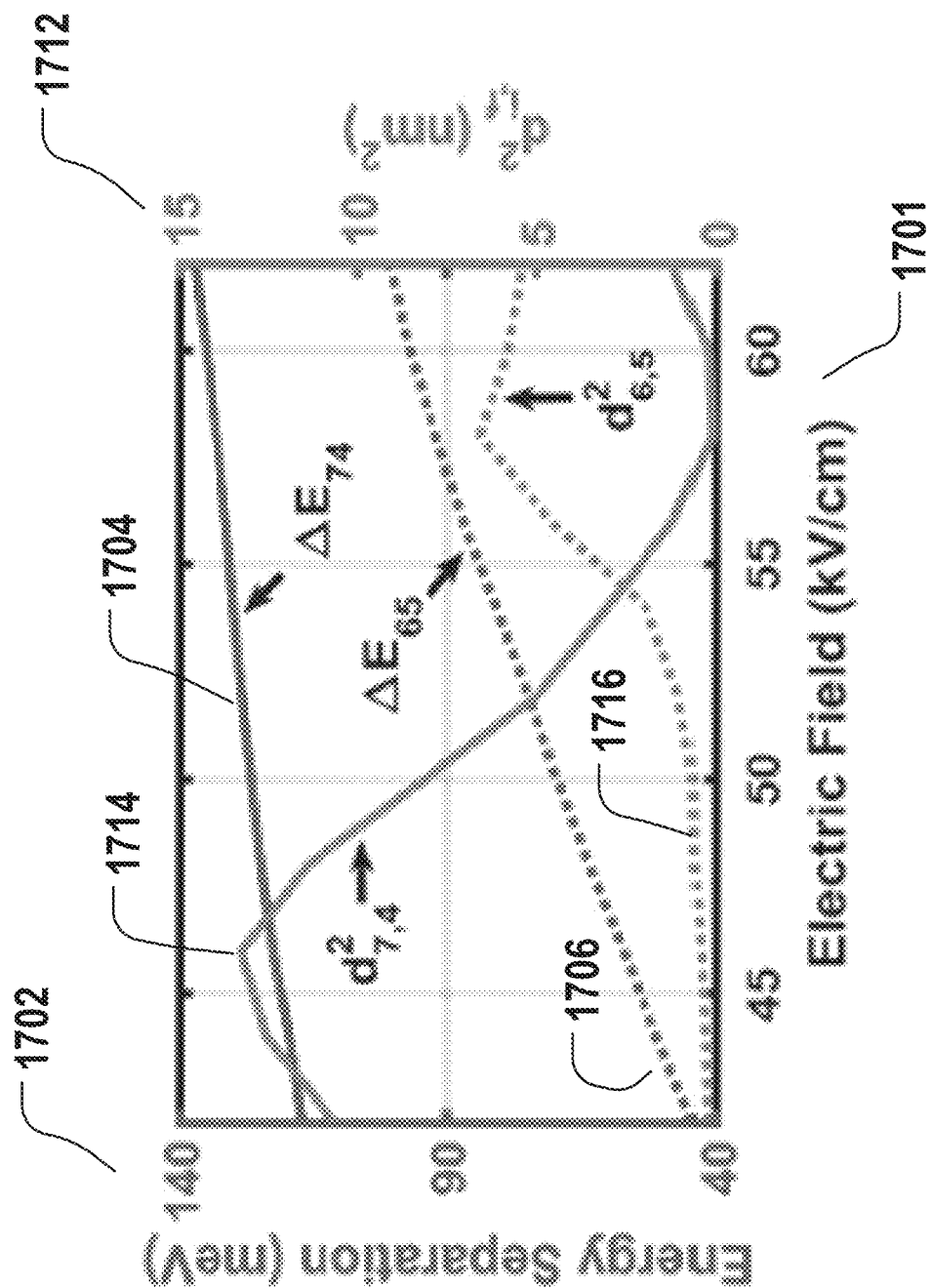

FIG. 17 shows two particular transition energy curves 1704 ($\Delta E_{74}$) and 1706 ($\Delta E_{65}$) for the (7, 4) and (6, 5) transitions (based on the energy scale 1702), respectively, as a function of the electric field 1701. These transition energies are large enough such that the electron wavefunctions in each pair of the two energy levels do not significantly overlap and therefore the electrons are likely to undergo radiative transition from one energy level to the other rather than via non-radiative relaxation. FIG. 17 further shows the TDMs 1714 and 1716 as a function the electric field, for the (7, 4), and (6, 5) transitions, respectively. FIG. 17 shows that not only the transition energies, but also the TDMs vary as the electric field is adjusted. For example, at an electric field between 42 KV/cm to 55 KV/cm, TDM for the (7, 4) transition is relatively large while the TDM for the (6, 5) transition is relatively small, whereas at an electric field between 55 KV/cm and 62 KV/cm, TDM for the (7, 4) transition is relatively small while the TDM for the (6, 5) transition is relatively large. As such, the TI-QCL device is likely to lase at wavelengths indicated by the curve 1704 at an electric field smaller than 55 KV/cm, and at wavelengths indicated by the curve 1706 at an electric field higher than 55 KV/cm. In other words, the lasing wavelength may transition from $\Delta E_{74}$ to $\Delta E_{65}$ as the electric field is tuned across ~55 KV/cm in the example of FIG. 17. Meanwhile, as level 5 (rather than level 4) becomes the lower lasing level for electric fields higher than 55 KV/cm, level 4 may take the place of level 3 and act as a depopulation level in the lower miniband. Hence, at high biases (high electric fields), levels 6 and 5 are the upper and lower lasing levels respectively, levels 8 and 7 are the injector levels, whereas level 4 may be the depopulation level with levels 1-3 coupled to level 8 in the next superlattice period.

In FIG. 17, it is shown that from F=42 kV/cm to 55 kV/cm, the lasing energy $\Delta E_{74}$ varies from 117.0 meV (wavelength of 10.61 µm) to 129.9 meV (wavelength of 9.56 µm), with a tunability sensitivity of 1.075 meV per kV/cm. For larger electric fields, i.e., from F=55 kV/cm to 62 kV/cm, the lasing energy $\Delta E_{65}$ varies from 86.8 meV (14.30 µm) to 100.6 meV (12.34 µm), with a tunability sensitivity of 2.3 meV per kV/cm. Hence, for any of the energy branches $\Delta E_{74}$ and $\Delta E_{65}$, FIG. 17 indicates that the lasing wavelength can be tuned by adjusting $V_{cb}$ in the TI-QCL device. While $V_{cb}$ is tuned, the charge neutrality condition may be slightly violated because of a particular selective doping level due to the nature of doping selectivity (in other words, the doping in the QCL may not be uniform). However, within this tuning range and under a particular injection rate, the overall charge neutrality (and therefore the roughly linear potential profile such as the energy profile 1304 shown in FIG. 13) may still be approximately maintained, providing overlapping lasing wavelength between neighboring periods of the superlattices and enhanced gain.

Figure 18B:
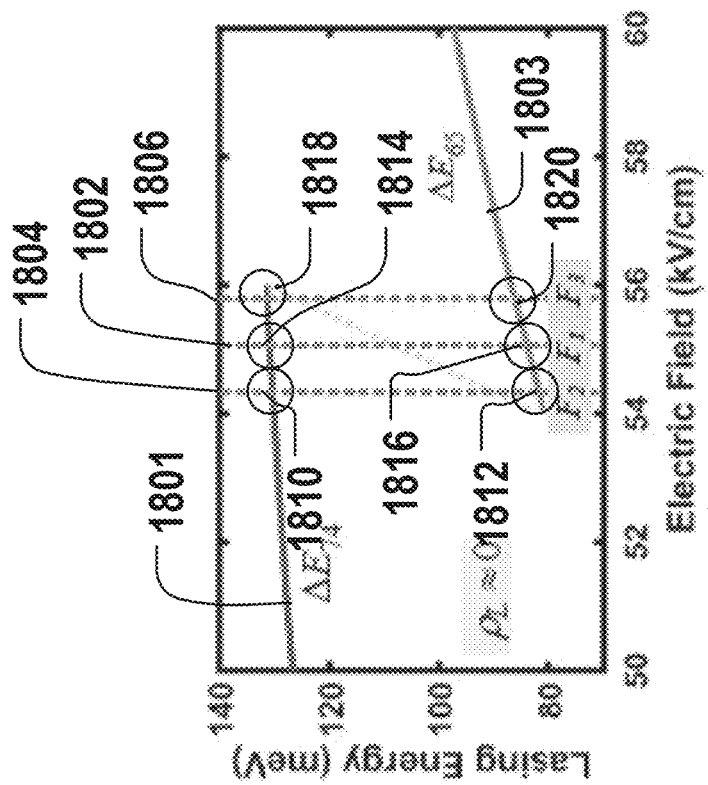
FIGS. 18a and 18b illustrates dual- or multi-color lasing in the unipolar structure.
Figure 18A:
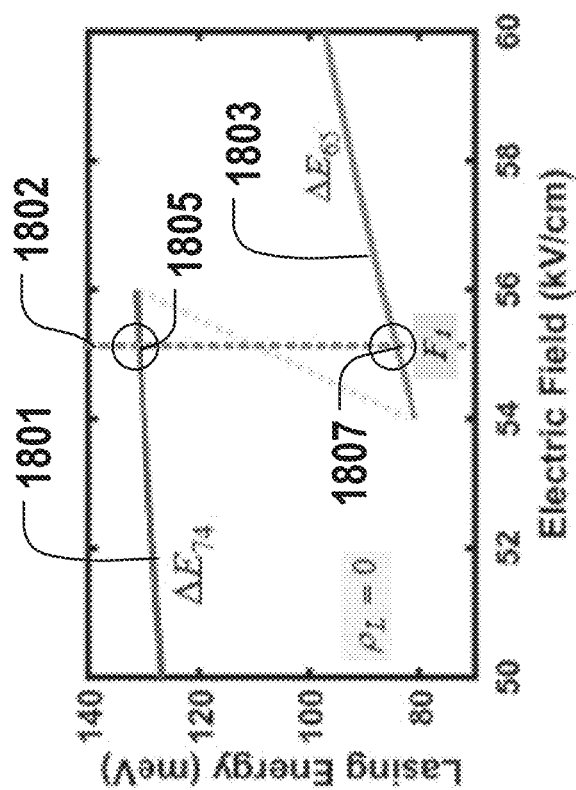

The wavelength switching capability as shown in FIG. 17 may be further used to achieve simultaneous two-color or multi-color lasing in the TI-QCL device 200 or 300 of FIG. 2 or 3. In the example of FIG. 17, when the electric field is set around the switching lasing bias of 55 kV/cm, where TDM of the $\Delta E_{74}$ transition drops below the TDM of the $\Delta E_{65}$ transition, simultaneous two-color or multi-color lasing may be achieved, as shown in FIGS. 18*a* and 18*b*. In FIG. 18*a*, the TI-QCL device is selective doped such that charge neutrality $\rho L=0$ is achieved in the range of electric field applied. Because each of the periods of the superlattices experience the same electric field such as $F_1$ 1802 due to charge neutrality, they all support the same optical transitions according to the curves 1801 and 1803. Around the switching field F1, lasing may occur for both energy branches represented by curves 1801 and 1802, as the TDMs at F1 for both transition braches are comparable. As such, simultaneous two-color lasing may be achieved. The two colors may have a wavelength separation as determined by the separation of the $\Delta E_{74}$ curve 1801 and the $\Delta E_{65}$ curve 1803 at a particular electric field around F1. For example, at electric field $F_1$1802 (55 KV/cm), the simultaneous two color lasing wavelengths corresponding to 129.9 meV (9.56 µm) as determined by point 1805 of the $\Delta E_{74}$ curve 1801 and 86.8 meV (14.30 µm) as determined by the point 1807 of the $\Delta E_{65}$ curve 1803 may be observed. In such a charge neutrality condition, the simultaneous two-color lasing action occurs in the same superlattice periods and in all superlattices due to the constant electric field across the superlattices.

When the charge in the quantum cascade laser structure is near but not exact at neutrality ($\rho_L \approx 0$), as shown in FIG. 18*b*, different groups of periods of superlattices in the quantum cascade laser structure 604 may see different electric fields. For example, some superlattice periods may see an electric field as small as $F_2$ 1804, some superlattice periods may see an electric field as large as $F_3$ 1806, and other superlattice periods may see other electric fields such as $F_1$ 1802 in between $F_2$ and $F_3$. As such, multi-color lasing may occur with the wavelengths determined from the $\Delta E_{74}$ and $\Delta E_{65}$ curves 1801 and 1803. For example, under the same bias, some superlattices may see actual field of $F_2$ and lases simultaneously at energies 1810 and 1812, some superlattices may see actual electric field of $F_1$ and lases at energies 1814 and 1816 under the same bias, whereas some other superlattices may see actual electric field of $F_3$ and lases at energies 1818 and 1820 at the same bias. As such, the TI-QCL device may lase simultaneously at multiple wavelengths in multiple superlattice periods. The deviation from exact charge neutrality thus may be controlled to determine the range of actual electric fields (one end being F2 and the other end being F3 in the example of FIG. 18*b*) seen by various superlattice periods. It may be preferable to have at least a number of superlattice periods to participate in each lasing wavelength for obtaining sufficient optical gain. As such, there may be a tradeoff between having a wide multi-color emission range (wide range of actual electric fields seen by different groups of superlattice periods) and sufficient gain for these wavelengths to lase. Compared to the narrow lasing peaks spacing ~0.1 meV of a conventional QCL with the same superlattice structure, the wider separation dual- or multi-wavelength lasing in the TI-QCL device is then expected to provide output laser having an MIR spectrum for applications involving, for example, simultaneous multiple-gas detection.

This disclosure further provides corresponding methods for fabricating and operating the TI-QCL device above. For example, the methods may include providing an intrinsic or properly doped semiconductor substrate as described above with respect to FIGS. 2 and 3, fabricating and providing a bipolar structure on the substrate as described above with respect to FIGS. 1-3, fabricating and providing a unipolar structure embedded in the bipolar structure as described above with respect to FIGS. 1-3, providing a QIM structure and a multi-period quantum cascade laser structure as part of the unipolar structure as described above with respect to FIG. 6, selectively doping the multi-period quantum cascade laser structure as described above with respect to FIG. 14, and providing an optical cavity enclosing the quantum cascade laser structure as described above with respect to FIG. 5. The methods may further include various steps for operating the TI-QCL device. For example, the methods may include providing at least two independent biases to the three-terminal TI-QCL device, providing at least a base-emitter bias and a base-collector base to generate laser emission, controlling the emitter-base bias to adjust lasing intensity, controlling the base-collector bias to achieve wavelength tunability, controlling the emitter-base bias to achieve charge neutrality, controlling the biases to achieve two-color lasing or multi-color lasing, and directing the laser output to excite a target system for sensing, testing, monitoring, imaging, or spectroscopic characterization.

The various above disclosed implementation of the TI-QCL device incorporating a three-terminal design and a QIM structure thus provide several operational and design tuning knobs and improved capabilities compared to conventional two-terminal QCL device without the QIM structure. For example, at least two operational parameter can be tuned, including both the forward base-emitter bias and the reverse base-collector bias. The base-emitter bias and base-collector bias can be independently controlled in operation to adjust the electron injection density and lasing wavelength, respectively. For the design of the TI-QCL device, the selective doping of the quantum cascade laser structure within the TI-QCL device may be adjusted to control the compensate for electron injection-induced space charge to achieve net charge neutrality and constant effective electric field at various periods in the multi-period quantum cascade laser structure. The selective doping, in addition the operational control afforded by the two biases applied via the three terminals, provides further capability to achieve simultaneous dual- or multi-color lasing. The TI-QCL device disclosed above may be employed in a wide range of applications. For example, in the MIR or Terahertz wavelength ranges, the laser output from these TI-QCL devices may provide optical excitation source having suitable wavelength, intensity, and optical coherence for sensing, testing, monitoring, imaging, and spectroscopic functions needed in applications including but not limited to material characterization, material detection/identification, and security/safety monitoring. The implementations disclosed herein further provide a tunable laser device having a compact monolithic structure rather than relying on other known tunable QCL structures.

The description and accompanying drawings above provide specific example embodiments and implementations. Drawings containing device structure and composition, for example, are not necessarily drawn to scale unless specifically indicated. Subject matter may, however, be embodied in a variety of different forms and, therefore, covered or claimed subject matter is intended to be construed as not being limited to any example embodiments set forth herein. A reasonably broad scope for claimed or covered subject matter is intended. Among other things, for example, subject matter may be embodied as methods, devices, components, or systems. Accordingly, embodiments may, for example, take the form of hardware, software, firmware or any combination thereof.

Throughout the specification and claims, terms may have nuanced meanings suggested or implied in context beyond an explicitly stated meaning. Likewise, the phrase "in one embodiment/implementation" as used herein does not necessarily refer to the same embodiment and the phrase "in another embodiment/implementation" as used herein does not necessarily refer to a different embodiment. It is intended, for example, that claimed subject matter includes combinations of example embodiments in whole or in part.

Unless defined otherwise, all technical and scientific terms used herein have the same meaning as commonly understood by one of skill in the art to which the invention pertains. Although any methods and materials similar to or equivalent to those described herein can be used in the practice or testing of the present invention, the preferred methods and materials are described herein In general, terminology may be understood at least in part from usage in context. For example, terms, such as "and", "or", or "and/or," as used herein may include a variety of meanings that may depend at least in part on the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Reference throughout this specification to features, advantages, or similar language does not imply that all of the features and advantages that may be realized with the present solution should be or are included in any single implementation thereof. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One of ordinary skill in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

What is claimed is:

1. A semiconductor laser device, comprising:
    a bipolar transistor structure having three terminals; and
    a unipolar semiconductor structure embedded in the bipolar transistor structure, comprising a multi-period quantum cascade laser structure and a quantum impedance matching structure,
    wherein the three terminals are configured to provide at least two controllable biases to the bipolar transistor structure for independently adjusting a lasing intensity and for tuning a lasing wavelength of the multi-period quantum cascade laser structure; and
    wherein the quantum impedance matching structure comprises a plurality of semiconductor layers with a band structure engineered to facilitate electron injection into at least one discrete quantum confined conduction energy level in the multi-period quantum cascade laser structure.

2. The semiconductor laser device of claim 1, wherein: the bipolar transistor structure comprises:
    a semiconductor collector region comprising a collector layer and a collector terminal in electric contact with the collector layer;
    a semiconductor base layer disposed on the semiconductor collector region and a base terminal in electric contact with the semiconductor base layer; and
    a semiconductor emitter layer disposed on the semiconductor base layer and an emitter terminal in electric contact with the semiconductor emitter layer, where the semiconductor emitter layer is separate from the semiconductor collector region;
    the unipolar semiconductor structure is sandwiched between the semiconductor base layer and the collector layer of the semiconductor collector region;
    the quantum impedance matching structure is stacked on and in electric contact with the multi-period quantum cascade laser structure; and
    the quantum impedance matching structure interfaces with the semiconductor base layer of the bipolar transistor structure and the multi-period quantum cascade laser structure interfaces with the collector layer.

3. The semiconductor laser device of claim 2, wherein the semiconductor emitter layer is n doped, the semiconductor base layer is p doped, and the collector layer is n doped.

4. The semiconductor laser device of claim 3, wherein the emitter terminal and the base terminal are configured to apply a first forward bias for controlling electron injection rate from the semiconductor base layer into the multi-period quantum cascade laser structure.

5. The semiconductor laser device of claim 4, wherein the base terminal and the collector terminal are configured to apply a second reverse bias to the multi-period quantum cascade laser structure.

6. The semiconductor laser device of claim 5, wherein the quantum impedance matching structure is configured to produce a flattened conduction band structure in the quantum impedance matching structure to form an electron reservoir for facilitating electron injection into the at least one discrete quantum confined conduction energy level in the multi-period quantum cascade laser structure close to its interface with the quantum impedance matching structure, when the second reverse bias is applied.

7. The semiconductor laser device of claim 6, wherein the quantum impedance matching structure comprises a layered i-n structure having at least an intrinsic semiconductor layer interfacing with the multi-period quantum cascade laser structure and at least an n-doped semiconductor layer interfacing with the semiconductor base layer.

8. The semiconductor laser device of claim 6, wherein the flattened conduction band structure in the quantum impedance matching structure comprises a shallow triangular potential trap at its interface with the multi-period quantum cascade laser structure.

9. The semiconductor laser device of claim 5, wherein the multi-period quantum cascade laser structure is configured to emitted an amplified electromagnetic radiation when the first forward bias and the second reverse bias are applied.

10. The semiconductor laser device of claim 9, wherein the various layers and structures are configured to generate the amplified electromagnetic radiation with a wavelength that is tunable as a function of the second reverse bias and that is independent of the first forward bias.

11. The semiconductor laser device of claim 9, wherein:
the multi-period quantum cascade laser structure comprises multiple periods of semiconductor superlattices; and
the multi-period quantum cascade laser structure is selectively n doped such that under a predetermined value for the first forward bias, an electric field produced by the second reverse bias across the multiple periods of semiconductor superlattices is non-varying.

12. The semiconductor laser device of claim 11, wherein the various layers and structures are configured to simultaneously generate the amplified electromagnetic radiation at a first wavelength band and a second wavelength band, wherein the amplified electromagnetic radiation at each of at the first wavelength band and the second wavelength band are produced by a majority of the multiple periods of semiconductor superlattices.

13. The semiconductor laser device of claim 9, wherein the multi-period quantum cascade laser structure comprises multiple periods of semiconductor superlattices; and
the multi-period quantum cascade laser structure is configured that that an electric field produced by the second reverse bias across the multiple periods of semiconductor superlattices varies.

14. The semiconductor laser device of claim 13, wherein:
the various layers and structures are configured to simultaneously generate the amplified electromagnetic radiation at a first wavelength band and a second wavelength band;
the amplified electromagnetic radiation at the first wavelength band is produced by a first subgroup of the multiple periods of semiconductor superlattices;
the amplified electromagnetic radiation at the second wavelength band is produced by a second subgroup of the multiple periods of semiconductor superlattices; and
the first subgroup of the multiple periods of semiconductor superlattices and the second subgroup of the multiple periods of semiconductor superlattices comprises non-common periods of superlattices.

15. The semiconductor laser device of claim 1, wherein the multi-period quantum cascade laser structure and the quantum impedance matching structure are based on group III-V, group II-VI, or group IV compounds.

16. A method for producing amplified emission of electromagnetic radiation, comprising:
providing a bipolar transistor structure having three terminals;
providing a unipolar semiconductor structure embedded in the bipolar transistor structure, comprising a multi-period quantum cascade laser structure and a quantum impedance matching structure, wherein:
the three terminals are configured to provide at least two controllable biases to the bipolar transistor structure for independently adjusting a lasing intensity and for tuning a lasing wavelength of the multi-period quantum cascade laser structure; and
the quantum impedance matching structure comprises a plurality of semiconductor layers with a band structure engineered to facilitate electron injection into at least one discrete quantum confined conduction energy level in the multi-period quantum cascade laser structure;
applying a first bias of the at least two controllable biases to control the electron injection into the multi-period quantum cascade laser structure to generate the amplified emission of electromagnetic radiation; and
applying a second bias of the at least two controllable biases independent of the first bias to control the lasing wavelength.

17. The method of claim 16, wherein: providing a bipolar transistor structure comprising providing:
a semiconductor collector region comprising a collector layer and a collector terminal in electric contact with the collector layer;
a semiconductor base layer disposed on the semiconductor collector region and a base terminal in electric contact with the semiconductor base layer; and
a semiconductor emitter layer disposed on the semiconductor base layer and an emitter terminal in electric contact with the semiconductor emitter layer, where the semiconductor emitter layer is separate from the semiconductor collector region; and
the unipolar semiconductor structure is sandwiched between the semiconductor base layer and the collector layer of the semiconductor collector region;
the quantum impedance matching structure is stacked on and in electric contact with the multi-period quantum cascade laser structure; and
the quantum impedance matching structure interfaces with the semiconductor base layer of the bipolar transistor structure and the multi-period quantum cascade laser structure interfaces with the collector layer.

18. The method of claim 17, wherein the quantum impedance matching structure is configured to produce a flattened conduction band structure in the quantum impedance matching structure to form an electron reservoir for facilitating the electron injection into the at least one discrete quantum confined conduction energy level in the multi-period quantum cascade laser structure close to its interface with the quantum impedance matching structure.

19. The method of claim 17, wherein the multi-period quantum cascade laser structure comprises multiple periods of semiconductor superlattices and wherein the method further comprises:

selectively doping the multi-period quantum cascade laser structure such that under a predetermined value for the first bias, an electric field produced by the second bias across the multiple periods of semiconductor superlattices substantially remain constant.

20. The method of claim 19, wherein the first bias and second bias are applied to generate the amplified emission of electromagnetic radiation simultaneously at a first wavelength band and a second wavelength band, wherein the amplified emission of electromagnetic radiation at each of at the first wavelength band and the second wavelength band are produced in a majority of the multiple periods of semiconductor superlattices.

21. The method of claim 17, wherein the multi-period quantum cascade laser structure comprises multiple periods of semiconductor superlattices, and the method further comprises:

selectively doping the multi-period quantum cascade laser structure such that an electric field produced by the second bias across the multiple periods of semiconductor superlattices varies.

22. The method of claim 21, wherein:

the first bias and second bias are applied to simultaneously generate the amplified emission of electromagnetic radiation at a first wavelength band and a second wavelength band;

the amplified emission of electromagnetic radiation at the first wavelength band is produced by a first subgroup of the multiple periods of semiconductor superlattices;

the amplified emission of electromagnetic radiation at the second wavelength band is produced by a second subgroup of the multiple periods of semiconductor superlattices; and the first subgroup of the multiple periods of semiconductor superlattices and the second subgroup of the multiple periods of semiconductor superlattices comprises non-common periods of superlattices.

23. The method of claim 16, wherein the multi-period quantum cascade laser structure and the quantum impedance matching structure are based on group III-V, group II-VI, or group IV compounds.

* * * * *